(12) United States Patent
Park et al.

(10) Patent No.: US 12,446,373 B2
(45) Date of Patent: Oct. 14, 2025

(54) DISPLAY PANEL AND PRODUCTION METHOD THEREOF

(71) Applicant: SAMSUNG ELECTRONICS CO., LTD., Suwon-si (KR)

(72) Inventors: Shang Hyeun Park, Yongin-si (KR); Deukseok Chung, Yongin-si (KR); Tae Gon Kim, Hwaseong-si (KR); Min Jong Bae, Yongin-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/519,534

(22) Filed: Nov. 27, 2023

(65) Prior Publication Data

US 2024/0105885 A1 Mar. 28, 2024

Related U.S. Application Data

(63) Continuation of application No. 17/523,162, filed on Nov. 10, 2021, now Pat. No. 11,870,018.

(30) Foreign Application Priority Data

Nov. 12, 2020 (KR) .......... 10-2020-0151380
Nov. 10, 2021 (KR) .......... 10-2021-0154082

(51) Int. Cl.
*H10H 20/851* (2025.01)
*H01L 25/16* (2023.01)
(Continued)

(52) U.S. Cl.
CPC ....... *H10H 20/8514* (2025.01); *H01L 25/167* (2013.01); *H10H 20/0361* (2025.01); *H10H 20/8513* (2025.01); *H10H 20/882* (2025.01)

(58) Field of Classification Search
CPC .......... H10H 20/8514; H10H 20/8513; H10H 20/882; H10H 20/0361; H01L 25/167
See application file for complete search history.

(56) References Cited

U.S. PATENT DOCUMENTS

| 10,947,403 B2 | 3/2021 | Isonaka et al. |
| 10,985,208 B2 | 4/2021 | Park et al. |

(Continued)

FOREIGN PATENT DOCUMENTS

| JP | 2007140214 | * | 6/2007 |
| JP | 2007140214 A | | 6/2007 |

(Continued)

OTHER PUBLICATIONS

Machine-generated English translation of JP 2007140214 (Year: 2007).*

(Continued)

*Primary Examiner* — Bo B Jang
(74) *Attorney, Agent, or Firm* — CANTOR COLBURN LLP

(57) ABSTRACT

A display panel including a wavelength conversion structure that includes a base structure including partition walls that define a first space and a second space, a first quantum dot composite disposed in the first space, and a second quantum dot composite disposed in the second space. The height of the partition wall is greater than or equal to about 5 micrometers and less than or equal to about 50 micrometers, and the first quantum dot composite provides a first top surface and the second quantum dot composite provides a second top surface. A production method for making the wavelength conversion structure uses a first ink composition that includes first quantum dots and a first matrix, and a second ink composition that includes second quantum dots and a second matrix.

21 Claims, 15 Drawing Sheets

(51) Int. Cl.
  *H10H 20/01*    (2025.01)
  *H10H 20/80*    (2025.01)

(56) References Cited

U.S. PATENT DOCUMENTS

| | | |
|---|---|---|
| 2015/0255505 A1 | 9/2015 | Jeoung et al. |
| 2018/0102449 A1 | 4/2018 | Pschenitzka et al. |
| 2018/0230321 A1 | 8/2018 | Pan et al. |
| 2019/0129302 A1 | 5/2019 | Youn et al. |
| 2019/0302917 A1 | 10/2019 | Pan |
| 2020/0144458 A1 | 5/2020 | Lee et al. |
| 2020/0279979 A1 | 9/2020 | Lee et al. |
| 2020/0350471 A1 | 11/2020 | Onuma et al. |
| 2021/0139730 A1 | 5/2021 | Isonaka et al. |

FOREIGN PATENT DOCUMENTS

| | | |
|---|---|---|
| JP | 2019081868 A | 5/2019 |
| JP | 2019112516 A | 7/2019 |
| KR | 20180021870 A | 3/2018 |
| KR | 20190038365 A | 4/2019 |
| KR | 20190098150 A | 8/2019 |
| KR | 20190098151 A | 8/2019 |
| KR | 20190102857 A | 9/2019 |
| KR | 20190108366 A | 9/2019 |

OTHER PUBLICATIONS

Extended European Search Report dated Apr. 5, 2022, of the corresponding European Patent Application No. 21207399.3.

\* cited by examiner

DISPLAY PANEL AND PRODUCTION METHOD THEREOF

CROSS-REFERENCE TO RELATED APPLICATION

This continuation application claims priority to U.S. patent application Ser. No. 17/523,162 filed Nov. 10, 2021, and Korean Patent Application Nos. 10-2020-0151380 and 10-2021-0154082, filed in the Korean Intellectual Property Office on Nov. 12, 2020, and Nov. 10, 2021, and all the benefits accruing therefrom under 35 U.S.C. §§ 119, 120, the contents of which in their entirety are herein incorporated by reference.

BACKGROUND

1. Field

Related are a display panel including a quantum dot composite and a production for making the quantum dot composite using an ink composition including a quantum dot.

2. Description of the Related Art

Display devices such as a liquid crystal display ("LCD"), a plasma display device, an organic light emitting diode ("OLED") display, and the like are commercially available. The display devices may be driven in an individual light emitting type wherein each of light emitting pixels can emit a selected wavelength of light such as red light, green light, blue light, and/or white light. In some instances, the display device may be driven in a manner wherein the light emitted from the light source may pass through a color filter to express a predetermined color of light corresponding to each of the pixels.

SUMMARY

An embodiment is related to an ink composition that provides a quantum dot color filter (e.g., a wave-conversion structure) for a high definition micro-LED device, e.g., a micro-LED device with an improved photo-efficiency and an absorption ratio.

An embodiment is related to a display panel including a wavelength conversion structure prepared by using the ink composition.

An embodiment is related to a production method of the color conversion structure or a display panel.

An embodiment is related to an electronic apparatus (or a display device) including the color conversion structure or a display panel.

In an embodiment, a display panel includes a light emitting element (e.g., including a light emitting unit) and a color conversion region disposed on the light emitting element, wherein the light emitting element is configured to provide the color conversion region with incident light. The color conversion region includes a wavelength conversion structure comprising a base structure including a partition wall(s), where the partition wall defines a first space and a second space, and a first quantum dot composite and a second quantum dot composite disposed in the first space and the second space, respectively. The first quantum dot composite includes a first matrix and a plurality of first quantum dots dispersed in the first matrix. The second quantum dot composite includes a second matrix and a plurality of second quantum dots dispersed in the second matrix. A height of the partition wall is greater than or equal to about 5 micrometers ($\mu m$) and less than or equal to about 50 $\mu m$.

The first space and the second space include a first open face and a second open face, respectively.

The first quantum dot composite and the second quantum dot composite are disposed in the first space and the second space, respectively, wherein the first quantum dot composite provides a first top surface facing the first open face and/or the second quantum dot composite provides a second top surface facing the second open face.

The partition wall may further define a third space in the wavelength conversion structure. The third space may be optically transparent to the incident light. In an embodiment, the wavelength conversion structure may further include a third quantum dot composite disposed in the third space. The third quantum dot composite may include a third matrix and a (plurality of) third quantum dot(s) dispersed in the third matrix.

At least a portion of the first top surface may be located below the first open face. At least a portion of the second top surface may be located below the second open face. The first (or second) open face may be defined or bound in-part by a height of the partition wall (e.g., adjacent walls). The first (or second) open face may be an imaginary face connecting the upper edges of the partition wall defining the first (or second) space.

The partition wall may include a silicon-containing inorganic material. The partition wall may consist of silicon, a silicon-containing inorganic material, or a combination thereof.

A height of the partition wall may be greater than or equal to about 6 $\mu m$, or greater than or equal to about 7 $\mu m$, and less than or equal to about 30 $\mu m$, less than or equal to about 25 $\mu m$, or less than or equal to about 10 $\mu m$.

The first quantum dot composite may fill the first space so as to occupy greater than or equal to about 70 percent (%) of an area of a vertical cross-section of the first space.

The second quantum dot composite may fill the second space so as to occupy greater than or equal to about 70% of an area of a vertical cross-section of the second space.

A width of a vertical cross-section of the first space may be greater than or equal to about 5 $\mu m$, greater than or equal to about 10 $\mu m$, or greater than or equal to about 15 um.

A width of a vertical cross-section of the second space may be greater than or equal to about 5 $\mu m$, greater than or equal to about 10 $\mu m$, or greater than or equal to about 15 um.

A width of a vertical cross-section of the third space may be greater than or equal to about 5 $\mu m$, greater than or equal to about 10 $\mu m$, or greater than or equal to about 15 um.

The first space may have an aspect ratio of less than or equal to about 3.5:1, less than or equal to about 3:1, less than or equal to about 2.5:1, less than or equal to about 2.3:1, less than or equal to about 2.2:1, less than or equal to about 2:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, or less than or equal to about 1:1, wherein the aspect ratio is defined a ratio of a height (or a depth), H to a width W.

The second space may have an aspect ratio of less than or equal to about 3.5:1, less than or equal to about 3:1, less than or equal to about 2.5:1, less than or equal to about 2.3:1, less than or equal to about 2.2:1, less than or equal to about 2:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, or less than or equal to about 1:1.

In an embodiment, the aspect ratio of the first space and the aspect ratio of the second space may be less than or equal to about 1:1, respectively.

In an embodiment, the first space and the second space may each independently have an aspect ratio of greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.5:1, or greater than or equal to about 3:1.

The first top surface of the first quantum dot composite may have a concave shape or a flat face.

The second top surface of the second quantum dot composite may have a concave shape or a flat face.

The first quantum dot composite may have a first bottom surface opposite the first top surface and proximate to the light emitting element.

The second quantum dot composite may have a second bottom surface opposite the second top surface and proximate to the light emitting element.

The first (or the second) bottom surface (hereinafter, bottom surface) may be open. The bottom surface may be closed (for example, by a substrate).

The first quantum dot composite and/or the second quantum dot composite may (each independently) be disposed in the first space and the second space of the wavelength conversion structure and configured to satisfy the following equations, respectively:

$$A1/H \leq 0.3$$

$$A2/H \leq 0.3$$

H: a height of the partition wall
A1: a gap distance between the first top surface and the first open face, and
A2: a gap distance between the second top surface and the second open face.

The value of the A1/H may be greater than or equal to about 0.00005 and less than or equal to about 0.29, less than or equal to about 0.28, less than or equal to about 0.25, less than or equal to about 0.2, less than or equal to about 0.15, less than or equal to about 0.1, or less than or equal to about 0.05.

The value of the A2/H may be greater than or equal to about 0.00005 and less than or equal to about 0.29, less than or equal to about 0.28, less than or equal to about 0.25, less than or equal to about 0.2, less than or equal to about 0.15, less than or equal to about 0.1, or less than or equal to about 0.05.

The A2 may be less than or equal to about 5 μm, less than or equal to about 3 μm, less than or equal to about 2 μm, less than or equal to about 1 μm, less than or equal to about 500 nm, less than or equal to about 300 nm, less than or equal to about 100 nm, or less than or equal to about 50 nm.

The A2 may be less than or equal to about 5 μm, less than or equal to about 3 μm, less than or equal to about 2 μm, less than or equal to about 1 μm, less than or equal to about 500 nm, less than or equal to about 300 nm, less than or equal to about 100 nm, or less than or equal to about 50 nm.

The first quantum dot composite (or the first quantum dots) may emit a first light and the second quantum dot composite (or the second quantum dots) may emit a second light that is different from the first light.

The third quantum dot composite may emit a third light, and the third light may have a luminescent peak wavelength different from the luminescent peak wavelengths of the first quantum dot composite (or the first quantum dots) and the second quantum dot composite (or the second quantum dots).

The first light may have a different luminescent peak wavelength from the second light. In an embodiment, a third space may be configured to pass or emit the incident light (or the third light). The third quantum dot composite may be configured to emit a third light.

The first light may have a full width at half maximum (fwhm) of a luminescent peak that is less than or equal to about 45 nm. The second light may have a full width at half maximum of a luminescent peak that is less than or equal to about 45 nm. The third light may have a full width at half maximum of a luminescent peak that is less than or equal to about 45 nm.

One of the first light and the second light may be green light, and the other may be red light. The first light may be red light and the second light may be green light. The first light may be green light and the second light may be red light. The third light may be blue light. The incident light may include blue light. The incident light may further include green light.

In the first quantum dot composite, the plurality of first quantum dots may be present in an amount of greater than or equal to about 10 weight percent (wt %) and less than or equal to about 30 wt %, based on a total weight of the first quantum dot composite.

In the second quantum dot composite, the plurality of second quantum dots may be present in an amount of greater than or equal to about 10 wt % and less than or equal to about 30 wt %, based on a total weight of the second quantum dot composite.

In the third quantum dot composite, the plurality of third quantum dots may be present in an amount greater than or equal to about 10 wt % and less than or equal to about 30 wt %, based on a total weight of the third quantum dot composite.

The first quantum dot composite may further include a (plurality of) first metal oxide fine particle(s). The first metal oxide fine particle(s) may be present in an amount of greater than or equal to about 0.5 wt % and less than or equal to about 5 wt %, based on a total weight of the first quantum dot composite.

The second quantum dot composite may further include a (plurality of) second metal oxide fine particle(s). The second metal oxide fine particle(s) may be present in an amount of greater than or equal to about 0.5 wt % and less than or equal to about 5 wt %, based on a total weight of the second quantum dot composite.

The third quantum dot composite or the third space may further include a (plurality of) third metal oxide fine particle(s) (e.g., dispersed in a third matrix). The third metal oxide fine particle may be present in an amount of greater than or equal to about 0.5 wt % and less than or equal to about 5 wt %, based on a total weight of the third quantum dot composite or a third composite.

The first matrix, the second matrix, and the third matrix (hereinafter, are at times referred to as "matrix") may each independently include a binder, a polymerization product of a monomer combination including a polymerizable monomer having a carbon-carbon double bond, or a combination thereof. The monomer combination may further include a (mono- or poly-) thiol compound.

The first quantum dot composite may fill an edge portion (e.g., the edges) of the first space (for examples the edges defined by the side walls and the substrate), for example, as confirmed with a microscopy image of a vertical cross-section of the wavelength conversion structure. The second quantum dot composite may fill an edge portion (e.g., the edges) of the second space (for examples the edges defined by the side walls and the substrate). The third (quantum dot) composite may fill an edge portion (for examples the edges defined by the side walls and the substrate) of the third space.

The first quantum dot composite, the second quantum dot composite, or the third quantum dot composite (hereinafter, referred to at times as "quantum dot composite") may have a quantum efficiency (or light conversion ratio) of greater than or equal to about 30%, greater than or equal to about 31%, greater than or equal to about 32%, greater than or equal to about 33%, greater than or equal to about 34%, or greater than or equal to about 35%. The quantum dot composite may have an incident light absorption ratio of greater than or equal to about 75%, greater than or equal to about 76%, greater than or equal to about 77%, greater than or equal to about 78%, or greater than or equal to about 79%. The quantum dot composite may show a photoconversion efficiency (e.g., light conversion efficiency, CE) of greater than or equal to about 42%, greater than or equal to about 43%, or greater than or equal to about 44%. The quantum dot composite may show a light conversion ratio with respect to the incident light that is greater than or equal to 30%.

The first space, the second space, or the third space may be in a shape of a trench hole or in a shape of a via hole.

The wavelength conversion structure may have an overcoat disposed over the base structure or the partition wall to cover the quantum dot composite (or the open face of the space).

The display panel may further include an optical element (e.g., an absorption type color filter or an incident light blocking element) over the color conversion region.

The light emitting element may include a plurality of light emitting units (e.g., a plurality of light sources).

The display panel may further include a light transmitting layer (or a substrate) between the light emitting element and the wavelength conversion structure.

In an embodiment, a display device includes the display panel.

In an embodiment, an electronic apparatus includes the wavelength conversion structure.

In an embodiment, a method of producing the display panel (or the wavelength conversion structure) includes:
  providing a base structure having the partition wall(s) to define the first space and the second space;
  preparing a first ink composition including the first quantum dots dispersed in a liquid vehicle, and a second ink composition including the second quantum dots dispersed in a liquid vehicle;
  depositing the first ink composition into the first space;
  depositing the second ink composition into the second space; and
  carrying out polymerization for the deposited first ink composition, and the deposited second ink composition, respectively, to form the first quantum dot composite in the first space and the second quantum dot composite in the second space, respectively;
  wherein a total solid content of the first ink composition is less than or equal to about 24 wt %, based on a total weight of the first ink composition,
  the first quantum dots in the first ink composition is present in an amount of greater than or equal to about 10 wt %, based on the total solid content of the first ink composition,
  the first ink composition has a viscosity of less than or equal to about 4.5 centipoise,
  the first ink composition has a contact angle with respect to a silicon substrate of greater than or equal to about 20 degrees and less than or equal to about 40 degrees.

In an embodiment, a total solid content of the second ink composition may be less than or equal to about 24 wt %, based on a total weight of the second ink composition, the second quantum dots in the second ink composition may be present in an amount of greater than or equal to about 10 wt %, based on the total solid content of the second ink composition, the second ink composition may have a viscosity of less than or equal to about 4.5 centipoise, and the second ink composition may have a contact angle with respect to a silicon substrate of greater than or equal to about 20 degrees and less than or equal to about 40 degrees.

The first ink composition and the second ink composition may, each independently, further include a first or second metal oxide fine particle, respectively. For example, in a first ink composition (or in a second ink composition), an amount of the metal oxide fine particle may be greater than or equal to about 0.5 wt % or less than or equal to about 5 wt %, based on the total solid content of the first ink composition (or the second ink composition).

In an embodiment, the partition wall(s) of the base structure may further define a third space. The method may further include preparing a third ink composition including the third quantum dots dispersed in a liquid vehicle; depositing the third ink composition into the third space; and polymerizing the deposited third ink composition to form the third quantum dot composite in the third space.

A total solid content of the third ink composition may be less than or equal to about 24 wt %, based on a total weight of the third ink composition. In the third ink composition, the plurality of third quantum dots may be present in an amount greater than or equal to about 10 wt %, based on the total solid content of the third ink composition.

The third ink composition may have a viscosity of less than or equal to about 4.5 centipoise. The third ink composition may have a contact angle with respect to a silicon substrate of greater than or equal to about 20 degrees and less than or equal to about 40 degrees.

The liquid vehicle may include an organic solvent, a polymerizable monomer (e.g., a photo-polymerizable monomer), or a combination thereof.

The depositing may include discharging (e.g., depositing by spraying) the (first, second, or third) ink composition toward the base structure, e.g., toward the (first, second, or third) space defined by the partition wall.

The polymerization may further include exposing the deposited ink composition to light.

The method may further include removing a (portion of) non-polymerized first or second ink composition (non-polymerized monomer etc.) from the base structure.

The spraying may be carried out at a spraying pressure of greater than or equal to about 1 pounds per square inch.

The spraying may be carried out at a spraying pressure of less than or equal to about 10 pounds per square inch.

The spaying may be carried out at a moving speed of greater than or equal to about 1 millimeters per second (mm/s).

The spaying may be carried out at a moving speed of less than or equal to about 100 mm/s.

In an embodiment, an ink composition is provided, which can be used in the making of a display device, in particular, a micro-LED device of an embodiment or in the above method.

An ink composition (hereinafter, is at times referred to as "a composition") of the embodiment includes a plurality of quantum dots and a liquid vehicle including an organic solvent, a polymerizable monomer, or a combination thereof. A total solid content of the composition may be greater than or equal to about 1 wt % (e.g., greater than or equal to about 5 wt %, greater than or equal to about 10 wt %, greater than or equal to about 15 wt %, greater than or equal to about 20 wt %, or greater than or equal to about 22 wt %) and less than or equal to about 24 wt %, (or less than or equal to about 23 wt %) based on a total weight of the composition. An amount of the quantum dots may be greater than or equal to about 10 wt %, greater than or equal to about 15 wt %, greater than or equal to about 20 wt %, or greater than or equal to about 22 wt %, and less than or equal to about 30 wt %, less than or equal to about 28 wt %, or less than or equal to about 25%, based on a weight of the total solid content of the composition. The compositions have a viscosity of less than or equal to about 4.5 centipoise (cps) and the composition is configured to exhibit a contact angel with respect to a silicon substrate of greater than or equal to about 20 degrees and less than or equal to about 40 degrees.

The contact angle may be measured by the circle or ring method.

The viscosity and the contact angle may be measured at room temperature (e.g., a temperature of 20 to 25 Celsius degrees or 23° C.

The composition may further include metal oxide fine particles.

In the composition, the metal oxide fine particles may be present in an amount of less than or equal to about 5 wt %, less than or equal to about 4 wt %, less than or equal to about 3 wt %, or less than or equal to about 2 wt %, based on a weight of the total solid content of the composition.

In the composition, the metal oxide fine particles may be present in an amount of greater than or equal to about 0.1 wt %, greater than or equal to about 0.5 wt %, greater than or equal to about 1 wt %, or greater than or equal to about 1.5 wt %, based on a weight of the total solid content of the composition.

In the composition, an amount of the metal oxide fine particles may be less than or equal to about 15 wt %, less than or equal to about 10 wt %, or less than or equal to about 5 wt %, based on a weight of the total solid content.

The composition may further include a binder (e.g., a polymer, a monomer, or a combination thereof) (for example, having a carboxylic acid group), a thiol compound (e.g., having one or more thiol groups), an initiator, or a combination thereof.

In the composition, based on a total weight of the composition, an amount of the binder may be from about 0.5 wt % to about 60 wt %.

In the composition, based on a total weight of the composition, an amount of the polymerizable monomer may be from about 0.5 wt % to about 60 wt %.

In the composition, based on a total weight of the composition, an amount of the thiol compound may be from about 0.1 wt % to about 60 wt %.

In the composition, based on a total weight of the composition, an amount of the initiator may be from about 0.01 wt % to about 10 wt %.

In an embodiment, in the composition, a weight ratio between a monomer combination including a monomer and optionally a thiol compound and the binder may be 1:about 0.5 to about 5, 1:about 0.8 to about 4.5, 1:about 1 to about 4, 1:about 1.5 to about 2.5, or a combination thereof.

The composition may provide a wavelength conversion structure capable of exhibiting a desired level of luminous properties (e.g., a light conversion-efficiency, a light absorption ratio, or the like). In an embodiment, the composition may include a desired amount of inorganics (e.g., quantum dots and/or metal oxide fine particle) and may fill a space of a given shape (e.g., a first, second, and/or third space having a predetermined depth or a predetermined aspect ratio such as a trench hole or a via hole). The wavelength conversion structure prepared by using the composition of an embodiment may find its use in a micro light emitting diode or a micro light emitting device.

In an embodiment, the composition may be applied to preparing an electronic device (e.g., micro-LED or a nano-LED) having a luminescent type color conversion region. The wavelength conversion structure or the display panel may be used in a virtual reality (VR) device, an actual reality (AR) device, a TV, a mobile device, a wearable device such as a watch, or a combination thereof.

BRIEF DESCRIPTION OF THE DRAWINGS

The above and other embodiments, advantages and features of this disclosure will become more apparent by describing in further detail embodiments thereof with reference to the accompanying drawings, in which.

DETAILED DESCRIPTION

Figure 1A:
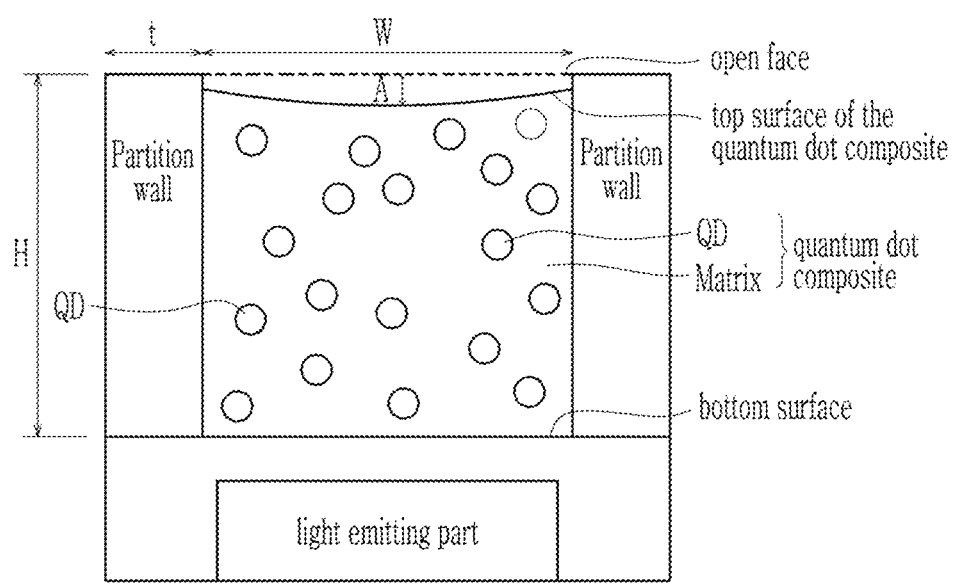
FIG. 1A is a schematic cross-sectional view of a display panel of an embodiment.

Hereinafter, referring to the drawings, embodiments are described in detail.

This invention may, however, be embodied in many different forms, and should not be construed as limited to the embodiments set forth herein. Like reference numerals refer to like elements throughout. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Also, since the size and thickness of each configuration shown in the drawing are arbitrarily shown for better understanding and ease of description, the disclosure is not necessarily limited thereto. Thus, embodiments described herein should not be construed as limited to the particular shapes of regions as illustrated herein but are to include deviations in shapes that result, for example, from manufacturing.

For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. For example, in the drawings, the thickness of layers, films, panels, regions, etc., are exaggerated for clarity. The thickness of some layers and regions is exaggerated for better understanding and ease of description in the drawings.

It will be understood that when an element such as a layer, film, region, or substrate is referred to as being "on" another element, it can be directly on the other element or intervening elements may also be present.

It will be understood that, although the terms "first," "second," "third" etc., may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

As used herein, the wording "concave" may also include "substantially concave." As used herein, the wording "flat" may also include "substantially flat."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, when a definition is not otherwise provided, "substituted" may refer to replacement of hydrogen of a compound or a group by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 cycloalkenyl group (i.e., a C3 to C15 cycloalkenyl group), a C3 to C30 cycloalkynyl group (i.e., a C6 to C30 cycloalkynyl group), a C2 to C30 heterocycloalkyl group, a halogen (—F, —Cl, —Br, or —I), a hydroxy group (—OH), a nitro group (—NO$_2$), a cyano group (—CN), an amino group or an amine group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, a hydrocarbon group refers to a group including (or consisting of) carbon and hydrogen (e.g., an alkyl, alkenyl, alkynyl, or aryl group). The hydrocarbon group may be a group having a valence of one (or greater) formed by removal of a hydrogen atom (or for example, a, e.g., at least one, hydrogen atom) from alkane, alkene, alkyne, or arene. In the hydrocarbon group, a, e.g., at least one, methylene may be replaced by an oxide moiety, a carbonyl moiety, an ester moiety, —NH—, or a combination thereof.

As used herein, "alkyl" refers to a linear or branched saturated monovalent hydrocarbon group (methyl, ethyl, hexyl, etc.).

As used herein, "alkenyl" refers to a linear or branched monovalent hydrocarbon group having a carbon-carbon double bond.

As used herein, "alkynyl" refers to a linear or branched monovalent hydrocarbon group having a carbon-carbon triple bond.

As used herein, "aryl" refers to a group formed by removal of a, e.g., at least one, hydrogen from an aromatic hydrocarbon (e.g., a phenyl or naphthyl group).

As used herein, "hetero" refers to one including one or more (e.g., 1 to 3) heteroatom of N, O, S, Si, P, or a combination thereof.

As used herein, "(meth)acryl" refers to acryl, methacryl, or a combination thereof.

In an embodiment, "dispersion" may be a system in which a dispersed phase is a solid and a continuous phase includes a liquid. In an embodiment, the term "dispersion" may refer to a colloidal dispersion, wherein the dispersed phase includes particles having a dimension of at least about 1 nanometer (nm) (e.g., at least about 2 nm, at least about 3 nm, or at least about 4 nm) and less than or equal to about several micrometers (μm) (e.g., 1 μm or less, 2 μm or less).

As used herein, unless a definition is otherwise provided, the term "Group" in the term Group III, Group II, and the like refers to a group of the Periodic Table of Elements.

As used herein, "Group I" refers to Group IA and Group IB, and may include Li, Na, K, Rb, and Cs but are not limited thereto.

As used herein, "Group II" refers to Group IIA and a Group IIB, and examples of the Group II metal may include Cd, Zn, Hg, and Mg, but are not limited thereto.

As used herein, "Group III" refers to Group IIIA and Group IIIB, and examples of the Group III metal may include Al, In, Ga, and Tl, but are not limited thereto.

As used herein, "Group IV" refers to Group IVA and Group IVB, and examples of the Group IV metal may include Si, Ge, and Sn but are not limited thereto. As used herein, the term "a metal" may include a semi-metal such as Si.

As used herein, "Group V" refers to Group VA and may include nitrogen, phosphorus, arsenic, antimony, and bismuth but is not limited thereto.

As used herein, "Group VI" refers to Group VIA and may include sulfur, selenium, and tellurium, but is not limited thereto.

In an embodiment, a dimension (e.g., a diameter, a radius, a thickness, a height, or the like) may be a value obtained from a single entity or an average obtained from a plurality thereof. The dimension can be obtained from an appropriate analytical tool such as a microscopy analysis, an electron microscopy analysis, an inductively coupled plasma atomic emission spectroscopy, or the like). As used therein, the term "average" may be a mean or a median.

In an embodiment, a quantum efficiency (also referred to as a quantum yield) may be a ratio, e.g., relative amount, of photons emitted from a nanostructure (e.g., quantum dot) or a population thereof with respect to the photons absorbed by the nanostructure (e.g., quantum dot) or a population thereof. In an embodiment, the quantum efficiency may be determined by any suitable method. The quantum efficiency may be measured by an absolute method and a relative method. The quantum efficiency (or quantum yield) may be measured in a solution state or a solid state (as in a quantum dot composite).

In the absolute method, the quantum yield may be determined by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescent wavelengths, but are not limited thereto.

The quantum yield (QY) may be readily and reproducibly determined by using commercially available equipment, for example, from Hitachi Co. Ltd or Hamamatsu Co. Ltd and referring to the instruction manuals provided from the manufacturer.

The full width at half maximum (FWHM) and the maximum luminescent peak wavelength may be determined by a (photo)luminescent spectrum obtained by a spectrophotometer (or Fluorescence Spectrophotometer).

As used herein, the term "cadmium-free" or "not including cadmium" or "not including a toxic heavy metal is intended that in a given entity, an amount of cadmium (or a given toxic heavy metal) is less than 100 ppm by weight of cadmium. The Restriction of Hazardous Substances (RoHS) compliance definition requires that there must be no more than 0.01% (100 ppm) by weight of cadmium in the raw homogeneous precursor materials.

The cadmium level in the Cd-free quantum dot is limited by the trace metal concentration in the precursor materials. The trace metal (including cadmium) concentration in the precursor materials for the Cd-free nanostructures, is measured by inductively coupled plasma mass spectroscopy (ICP-MS) analysis, and are on the parts per billion (ppb) level. In an embodiment of a cadmium free quantum dot, an amount of cadmium may be less than about 50 ppm, less than about 20 ppm, less than about 10 ppm, or less than about 1 ppm.

In an embodiment, room temperature may be a temperature from about 20 Celsius degrees (° C.) to about 30° C., 23° C.-25° C., or a combination thereof.

A quantum dot (QD) composite can find its use in a variety of display devices for example as a luminescent type color filter or a color conversion region. The display device may be a liquid crystal display (LCD). The display device may be an organic light emitting diode (OLED) based display device, or a display device including an individual light emitting light source such as a micro light emitting diode (μ-LED). An individually light emitting type display device may realize a relatively high color purity and a higher definition. The individually light emitting type display device may include a wavelength conversion structure including a plurality of quantum dot composites, each disposed in an individual tiny-scaled (e.g., a micro-sized) space corresponding to a pixel area. Therefore, using a conventional quantum dot-containing ink composition may pose considerable technological difficulties in a production process or an enlargement for such a device.

In an embodiment, a display panel includes a light emitting element including a light emitting unit (e.g., a plurality of light emitting units) and a color conversion region disposed on or over the light emitting element, wherein the light emitting element is configured to provide the color conversion region with incident light. The color conversion region includes a wavelength conversion structure including a partition wall (or partition walls, hereinafter, referred to at times as "partition wall"). The partition wall defines a space, e.g., a first or second space.

In an embodiment, the wavelength conversion structure (herein, which can be at times simply referred to as "structure") may be prepared using an ink composition described herein. In an embodiment, the structure includes the partition wall(s) (e.g., a plurality of side walls such as a first side wall, a second side wall, or a third side wall) and a plurality of quantum dot composites (e.g., a first quantum dot composite, a second quantum dot composite, and optionally a third quantum dot composite, hereinafter, also referred to as "quantum dot composite"). The ink compositions may be used to prepare the quantum dot composites.

The quantum dot composite (i.e., a first quantum dot composite, a second quantum dot composite, and optionally a third quantum dot composite) may be disposed in a space (i.e., a first space, a second space, and optionally a third space) defined by the partition wall, respectively. The quantum dot composite may include a matrix (e.g., a first matrix, a second matrix, or a third matrix) and a plurality of quantum dots (QD, e.g., first quantum dots, second quantum dots, and optionally third quantum dots) dispersed in the matrix.

The matrix may include a binder, a polymerization product of a monomer combination including a polymerizable monomer having a carbon-carbon double bond, or a combination thereof. The third space may include an optically transparent composite (for example, including a polymer matrix and metal oxide fine particles, optionally together with the third quantum dots).

Unless described to the contrary, details for the first space set forth herein may be applied to the second space and the third space. Unless described to the contrary, details for the first quantum dot composite may be applied to the second quantum dot composite and the third quantum dot composite.

Figure 1B:
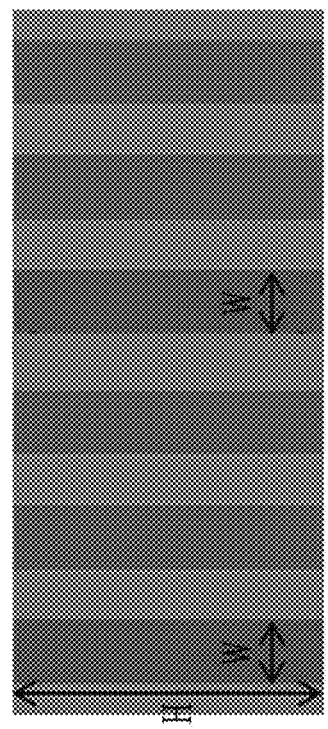
FIG. 1B shows a top view and a cross-section view of a wavelength conversion structure of an embodiment, for example having a trench hole.
Figure 1B:
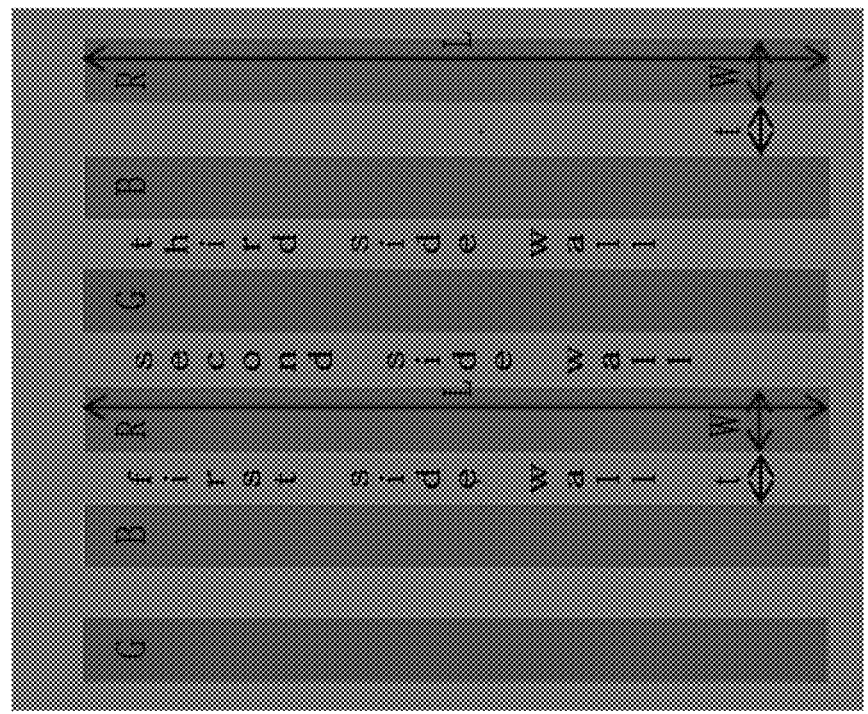

FIG. 1A shows a schematic cross-sectional view of a display panel of an embodiment, which includes a wavelength conversion structure and a light emitting element. FIG. 1B shows a top view and a cross-section view of a wavelength conversion structure, for example having a trench hole, in an embodiment, and FIG. 1C shows a top view and a cross-section view of a wavelength conversion structure, for example having a via hole, in an embodiment.

Referring to FIG. 1A, in the wavelength conversion structure, the partition wall defines a first space and a second space (not shown). A first quantum dot composite and a second quantum dot composite (hereinafter, "quantum dot composite) may be disposed in the first space and the second space, respectively.

Figure 1C:
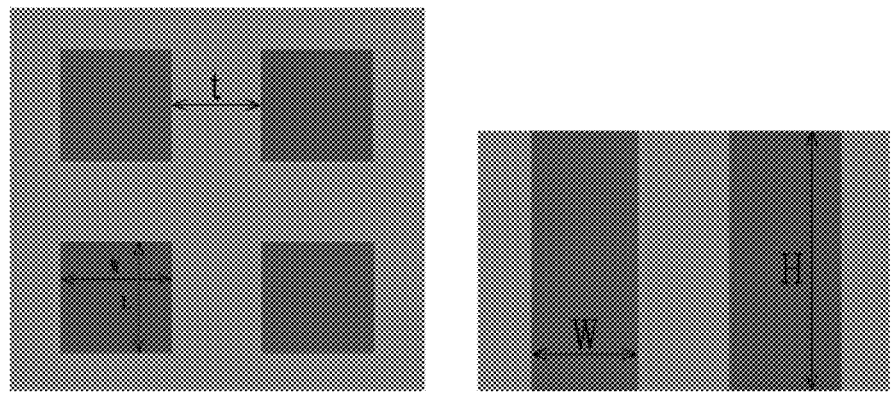
FIG. 1C shows a top view and a cross-section view of a wavelength conversion structure of an embodiment, for example having a via hole.

Referring to FIGS. 1B and 1C, in the structure, the first space may be adjacent to the second space. The partition wall may further define a third space adjacent to the first space and/or the second space.

The partition wall may have any shape, which is not particularly limited. A width t of the partition wall may be selected appropriately and is not particularly limited.

The width t of the partition wall may be greater than or equal to about 100 nm, greater than or equal to about 500 nm, greater than or equal to about 1 µm, greater than or equal to about 1.5 µm, greater than or equal to about 2 µm, greater than or equal to about 2.5 µm, greater than or equal to about 3 µm, greater than or equal to about 3.5 µm, greater than or equal to about 4 µm, greater than or equal to about 4.5 µm, or greater than or equal to about 5 um. A vertical length or height H of the partition wall may correspond to a height of a space, which the partition wall defines.

The partition wall may include silicon, a silicon oxide, or a combination thereof.

The space (e.g., a first space, a second space, or a third space) may have an open face (i.e., a first open face, a second open face, or a third open face), e.g., opened physically or optically for a light extraction. The open face may be an imaginary planar face defined or bound in-part by top end surfaces of adjacent walls as denoted by a broken line in FIG. 1A.

In an embodiment, the space may have a bottom face (e.g., a first bottom face, a second bottom face, or a third bottom face). The bottom face of the space may be open. The bottom face of the space may be closed, for example, by a substrate. Details of the substrate will be explained below. The partition wall may be disposed on the substrate and the bottom face may correspond to a surface of the substrate.

The quantum dot composite may fill at least one edge of the space. In an embodiment, the first quantum dot composite may be disposed to fill an edge (or both edges) formed by the partition wall and a surface of the substrate, in the case of a closed bottom surface. In an embodiment, the second quantum dot composite may be disposed to fill an edge(s) formed by the partition wall, and in the case of a closed bottom surface, a surface of the substrate.

A vertical cross-section of the space may have a width W and an aspect ratio (i.e., a ratio of a depth or height H with respect to the width W, H/W). The width may be a distance between the adjacent sidewalls (e.g., a distance between the first side wall and the second side wall, or a distance between the second side wall and the third sidewall). The height (or the depth) H of the space may correspond to a (vertical) length of the partition wall.

The quantum dot composite (e.g., the first quantum dot composite, the second quantum dot composite, or if present the third quantum dot composite) may fill the space (i.e., the first space, the second space, and the third space) so that the composite (or a vertical cross-section of the composite) may account for greater than or equal to about 70%, greater than or equal to about 75%, greater than or equal to about 80%, greater than or equal to about 85%, or greater than or equal to about 90% of a vertical cross section area of the space (i.e., the first space, the second space, or the third space). The quantum dot composite may fill the space so that the composite (or a vertical cross-section of the composite) may account for greater than or equal to about 91%, greater than or equal to about 92%, greater than or equal to about 93%, greater than or equal to about 94%, greater than or equal to about 95%, greater than or equal to about 97%, greater than or equal to about 99%, greater than or equal to about 99.5%, greater than or equal to about 99.9%, or to about 100%.

In an embodiment, a ratio (percentage, %) of a vertical cross-section area of the quantum dot composite to a vertical cross-section area of the space may be greater than or equal to about 65%, greater than or equal to about 66%, greater than or equal to about 67%, greater than or equal to about 68%, greater than or equal to about 69%, greater than or equal to about 70%, greater than or equal to about 75%, greater than or equal to about 78%, greater than or equal to about 80%, greater than or equal to about 82%, greater than or equal to about 85%, greater than or equal to about 87%, greater than or equal to about 90%, or greater than or equal to about 95% greater than or equal to about 97%, greater than or equal to about 99%, greater than or equal to about 99.5%, greater than or equal to about 99.9%, or to about 100%.

The percentage of the vertical cross-section area of the (first, second, or third) quantum dot composite to the vertical cross-section area of the (first, second, or third) space may be calculated by the following equation:

$$\{(\text{vertical cross-section area of the composite})/(\text{vertical cross-section area of the space})\} \times 100(\%).$$

The vertical cross-section area of the quantum dot composite and the vertical cross-section area of the space may be measured or determined readily from a microscopy image of the structure, and optionally with a suitable image analysis program or open source code (e.g., Image J).

The width W of the space (or the distance between the adjacent side walls of the partition wall) may be greater than or equal to about 5 μm, greater than or equal to about 6 μm, greater than or equal to about 7 μm, greater than or equal to about 8 μm, greater than or equal to about 9 μm, greater than or equal to about 10 μm, greater than or equal to about 11 μm, greater than or equal to about 12 μm, greater than or equal to about 13 μm, greater than or equal to about 14 μm, or greater than or equal to about 15 μm. The width W may be less than or equal to about 80 μm, less than or equal to about 40 μm, less than or equal to about 30 μm, less than or equal to about 25 μm, or less than or equal to about 20 μm. The width W may be in a range of about 6 μm to about 40 μm, about 7 μm to about 30 μm, about 8 μm to about 20 μm, or a combination thereof.

In an embodiment, for example, for improved optical properties (e.g., a desired level of brightness in the display device), the height H of the space (or the vertical length H of the partition wall) may be, greater than or equal to about 5 μm, greater than or equal to about 6 μm, greater than or equal to about 7 μm, greater than or equal to about 8 μm, greater than or equal to about 9 μm, greater than or equal to about 10 μm, greater than or equal to about 11 μm, greater than or equal to about 12 μm, greater than or equal to about 13 μm, greater than or equal to about 14 μm, greater than or equal to about 15 μm, greater than or equal to about 16 μm, greater than or equal to about 17 μm, greater than or equal to about 18 μm, greater than or equal to about 19 μm, greater than or equal to about 20 μm, greater than or equal to about 21 μm, greater than or equal to about 22 μm, greater than or equal to about 23 μm, greater than or equal to about 24 μm, greater than or equal to about 25 μm, greater than or equal to about 26 μm, greater than or equal to about 27 μm, greater than or equal to about 28 μm, greater than or equal to about 29 μm, greater than or equal to about 30 μm, greater than or equal to about 31 μm, greater than or equal to about 32 μm, greater than or equal to about 33 μm, greater than or equal to about 34 μm, greater than or equal to about 35 μm, greater than or equal to about 36 μm, greater than or equal to about 37 μm, greater than or equal to about 38 μm, greater than or equal to about 39 μm, greater than or equal to about 40 μm, or greater than or equal to about 45 μm.

The height H may be less than or equal to about 100 μm, less than or equal to about 70 μm, less than or equal to about 60 μm, less than or equal to about 50 μm, less than or equal to about 45 μm, less than or equal to about 40 μm, or less than or equal to about 35 μm. The height may be in a range of about 6 μm to about 30 μm, about 7 μm to about 25 μm, about 8 μm to about 24 μm, or a combination thereof.

The height H of the space may be extended along a light extraction direction. The width of the space may be extended substantially perpendicular to a light extraction direction.

The aspect ratio (H:W) of the space (e.g., the first space, the second space, or the third space) may be greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.5:1, or greater than or equal to about 3:1. The aspect ratio of the space may be less than or equal to about 10:1, less than or equal to about 8:1, less than or equal to about 6:1, less than or equal to about 5:1, less than or equal to about 4:1, less than or equal to about 3.5:1, less than or equal to about 3:1, less than or equal to about 2.5:1, less than or equal to about 2.3:1, less than or equal to about 2.2:1, less than or equal to about 2:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, or less than or equal to about 1:1. The aspect ratio is a ratio of the height H to the width W.

In an embodiment, the space may have an aspect ratio of less than about 1:1, respectively.

The cross-section of the space may have any shape (e.g., a polygon such as a rectangle, a square, a circle, an ellipsoid, or the like), which is not particularly limited.

In an embodiment, the space may be in a form of a trench hole, and a top view of the space is a rectangle (see FIG. 1B). Referring to FIG. 1B, when the space has a shape of a trench hole, a length L of the trench hole may be extended in a direction perpendicular to the width W of the space. The length of the trench hole may be greater than or equal to about 2 times, greater than or equal to about 3 times, greater than or equal to about 4 times, greater than or equal to about 5 times, greater than or equal to about 6 times, greater than or equal to about 7 times, or greater than or equal to about 8 times, of the width of the space. The length of the trench hole may be less than or equal to about 500 times, less than or equal to about 300 times, less than or equal to about 100 times, less than or equal to about 50 times, less than or equal to about 30 times, less than or equal to about 10 times, of the width of the space.

In an embodiment, the space may be in a form of a via hole, and a top view of the space is a square (see FIG. 1C) or circle. Referring to FIG. 1C, when the space has a shape of a via hole, a length L of the hole may be extended in a direction perpendicular to the width W of the space, and the length of the via hole may from 0.5 times to 3 times, from 1 time to 2.5 times, or from 1.5 times to 2 times, of the width of the space, but is not limited thereto.

The length of the hole (e.g., the trench hole or the via hole), L may be greater than or equal to about 1 μm, greater than or equal to about 2 μm, greater than or equal to about 3 μm, greater than or equal to about 4 μm, greater than or equal to about 5 μm, greater than or equal to about 7 μm, greater than or equal to about 9 μm, greater than or equal to about 10 μm, greater than or equal to about 20 μm, greater than or equal to about 50 μm, greater than or equal to about 70 μm, or greater than or equal to about 100 μm, but is not limited thereto. The length of the hole, L may be less than or equal to about 1 mm, less than or equal to about 0.5 mm, less than or equal to about 0.1 mm, less than or equal to about 900 μm, less than or equal to about 400 μm, or less than or equal to about 300 μm.

In the wavelength conversion structure, a top surface of the quantum dot composite may be opposite to (e.g., may face with) an open face of the space (e.g., see, FIG. 1A). In an embodiment, a first top surface of the first quantum dot composite, and/or a second top surface of the second quantum dot composite may be opposite to the first open face of the first space and the second open face of the second space, respectively. At least a portion (or the entire) of the first top surface may exist below a plane of the first open face (for example, an imaginary plane connecting the upper edges of adjacent walls as illustrated in FIG. 1A). In an embodiment, at least a portion (or the entire) of the second top surface may exist below a plane of the second open face.

The top surface of the quantum dot composite may form a substantially curved (or inward curved) top face (e.g., a concave shape top face) or a substantially flat face.

The gap distance A (i.e., the longest length of a straight line extending vertically from the open face to the top surface) may be less than or equal to about 5 μm, less than or equal to about 3 μm, less than or equal to about 2 μm, less than or equal to about 1 μm, less than or equal to about 900 nm, less than or equal to about 800 nm, less than or equal to about 700 nm, less than or equal to about 600 nm, less than or equal to about 500 nm, less than or equal to about 400 nm, less than or equal to about 300 nm, less than or equal to about 200 nm, less than or equal to about 100 nm, or less than or equal to about 50 nm. The gap distance may be 1 nm to 5 um, 10 nm-3 um, 50 nm-2 um, 100 nm-1 um, 200 nm-900 nm, 300 nm-800 nm, or a combination thereof.

In the wavelength conversion structure, the first quantum dot composite and/or the second quantum dot composite may be (each independently) disposed to satisfy the following equations, respectively:

$$A1/H \leq 0.3$$

$$A2/H \leq 0.3$$

H: the height of the partition wall
A1: a gap distance between the first top surface and the first open face
A2: a gap distance between the second top surface and the second open face.

The A1/H value may be greater than or equal to about 0.00005, greater than or equal to about 0.0001, greater than or equal to about 0.0005, greater than or equal to about 0.001, greater than or equal to about 0.003, greater than or equal to about 0.004, greater than or equal to about 0.005, greater than or equal to about 0.01, or greater than or equal to about 0.02, and less than or equal to about 0.29, less than or equal to about 0.28, less than or equal to about 0.25, less than or equal to about 0.2, less than or equal to about 0.15, less than or equal to about 0.1, or less than or equal to about 0.05.

The A2/H value may be greater than or equal to about 0.00005, greater than or equal to about 0.0001, greater than or equal to about 0.0005, greater than or equal to about 0.001, greater than or equal to about 0.003, greater than or equal to about 0.004, greater than or equal to about 0.005, greater than or equal to about 0.01, or greater than or equal to about 0.02, and less than or equal to about 0.29, less than or equal to about 0.28, less than or equal to about 0.25, less than or equal to about 0.2, less than or equal to about 0.15, less than or equal to about 0.1, or less than or equal to about 0.05.

In an embodiment, the A1/H value or the A2/H value may be in a range of about 0.00005 to about 0.32, from about 0.0001 to about 0.3, from about 0.0005 to about 0.29, from about 0.001 to about 0.28, from about 0.003 to about 0.27, from about 0.004 to about 0.26, from about 0.005 to about 0.25, from about 0.01 to about 0.24, from about 0.02 to about 0.23, from about 0.03 to about 0.21, from about 0.04 to about 0.2, from about 0.05 to about 0.19, from about 0.06 to about 0.18, from about 0.07 to about 0.17, from about 0.08 to about 0.16, from about 0.09 to about 0.15, from about 0.1 to about 0.14, or any combined range recited herein.

The A1 may be less than or equal to about 5 μm, less than or equal to about 3 μm, less than or equal to about 2 μm, less than or equal to about 1 μm, less than or equal to about 500 nm, less than or equal to about 300 nm, less than or equal to about 100 nm, or less than or equal to about 50 nm. The A2 may be less than or equal to about 5 μm, less than or equal to about 3 μm, less than or equal to about 2 μm, less than or equal to about 1 μm, less than or equal to about 500 nm, less than or equal to about 300 nm, less than or equal to about 100 nm, or less than or equal to about 50 nm.

The A1 or the A2 may be each independently from about 10 nm to about 5 μm, from about 50 nm to about 1 μm, from about 100 nm to about 500 nm, or any combined range recited herein.

The quantum dots may be included in a composition to form a pattern, e.g., using a photoresist process. However, the present inventors have found that such compositions may not provide satisfactory loading properties for the space defined by the partition wall having a dimension recited herein. Surprisingly, the present inventors have found that the structure having the partition wall having a dimension recited herein can be filled by adopting an ink composition of an embodiment, which is described herein in detail.

The first quantum dot composite and the second quantum dot composite may emit light having different colors with each other. In an embodiment, the first quantum dot may emit a first light and the second quantum dot composite may emit a second light that has a different luminescent peak wavelength from the first light. The third space may be configured to pass incident light or emit a third light. The third space may include a composite including a (polymer) matrix; and a (non-emissive) metal oxide fine particle(s), and optionally, third quantum dots dispersed in the matrix. If present, the third quantum dots may emit a third light that is different from the first light and the second light.

The first light or the second light may be a red light having a luminescent peak wavelength of from about 600 nm to 650 nm (e.g., between 620 nm and 650 nm) or a green light having a luminescent peak wavelength of from about 500 nm to about 550 nm (e.g., between 510 nm and 540 nm). In an embodiment, the first light may be red light and the second light may be green light. In an embodiment, the first light may be green light and the second light may be red light. The third light may have a luminescent peak wavelength of from about 380 nm to about 480 nm. The third light may be blue light, e.g., having a luminescent peak wavelength of less than 500 nm, e.g., from about 430 nm to about 470 nm, or from about 440 nm to about 460 nm.

In the quantum dot composite, the quantum dots may be present in an amount of greater than or equal to about 10 wt %, based on a total weight of the composite. In the quantum dot composite, the quantum dots may be present in an amount of less than or equal to about 30 wt %, based on a total weight of the composite. The weight of the composite may substantially correspond to a weight of a total solid content of the composition.

In the quantum dot composite, the quantum dots may be present in an amount of greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, greater than or equal to about 20 wt %, greater than or equal to about 21 wt %, greater than or equal to about 22 wt %, greater than or equal to about 23 wt %, or greater than or equal to about 24 wt %, based on a total weight of the composite.

In the quantum dot composite, the quantum dots may be present in an amount of less than or equal to about 30 wt %, less than or equal to about 29 wt %, less than or equal to about 28 wt %, less than or equal to about 27 wt %, less than or equal to about 26 wt %, less than or equal to about 25 wt %, less than or equal to about 20 wt %, less than or equal to about 19 wt %, less than or equal to about 17 wt %, or less than or equal to about 15 wt %, based on a total weight of the composite.

In a non-limiting embodiment, the quantum dots may be present in an amount from about 10 wt % to about 30 wt %, from about from about 12 wt % to about 27 wt %, from about 14 wt % to about 26 wt %, from about 16 wt % to about 25 wt %, from about 18 wt % to about 24 wt %, or from about 20 wt % to about 23 wt %, based on a total weight of the composite.

The quantum dot composite may further include metal oxide fine particles dispersed in the matrix. In the quantum dot composite, the metal oxide fine particles may be present in an amount of less than or equal to about 5 wt %, based on a total weight of the composite.

In the composite or the quantum dot composite, the metal oxide fine particles may be present in an amount of less than or equal to about 5 wt %, less than or equal to about 4 wt %, less than or equal to about 3 wt %, less than or equal to about 2 wt %, or less than or equal to about 1.75 wt %, based on a total weight of the composite. In the composite or the quantum dot composite, the amount of the metal oxide fine particles may be greater than or equal to about 0.5 wt %, greater than or equal to about 0.75 wt %, greater than or equal to about 1.0 wt %, greater than or equal to about 1.25 wt %, or greater than or equal to about 1.5 wt %, based on a total weight of the composite. In the composite or the quantum dot composite, an amount of the metal oxide fine particle may be from about 0.5 wt % to about 5 wt %, from about 0.75 wt % to about 4 wt %, from about 1.0 wt % to about 3 wt %, from about 1.25 wt % to about 2 wt %, from about 1.5 wt % to about 1.75 wt %, or a combined range thereof, based on a total weight of the composite.

The matrix may be a polymer matrix. In an embodiment, the (polymer) matrix may include a dispersing agent (e.g., a binder monomer or polymer having a carboxylic acid group), a polymerization product of a monomer combination including a monomer including a carbon-carbon double bond, or a combination thereof. The monomer may be a (photo-)-polymerizable monomer. The monomer combination may further include a (mono- or poly-) thiol compound having at least one, two, three, four thiol groups (for example at its terminal end). In the monomer, the number of the carbon-carbon double bond may be one, two, three, four, five, or greater. The polymerization product may be an electrically insulating polymer.

Details of the quantum dots, the dispersing agent, the binder (polymer), the polymerizable monomer, the (mono- or poly-) thiol compound, the metal oxide fine particle are described in detail herein, for example, in relation to the ink composition.

In an embodiment, an amount of the matrix in the composite or the quantum dot composite may be from about 10 wt % to about 90 wt %, from about 15 wt % to about 85 wt %, from about 20 wt % to about 80 wt %, from about 25 wt % to about 75 wt %, from about 30 wt % to about 70 wt %, from about 35 wt % to about 65 wt %, from about 40 wt % to about 60 wt %, from about 45 wt % to about 55 wt %, or about 50 wt %, or any combined range thereof, based on a total weight of the composite or the quantum dot composite.

According to an embodiment, a composition for the aforementioned quantum dot composite may fill the space of the wavelength conversion structure in the form recited herein (e.g., in the form of a trench hole or a via hole) to a desired extent. The composite and the composition of an embodiment may exhibit a desired level of luminous efficiency together with an improved absorption ratio for the incident light.

Accordingly, in an embodiment, a method of producing the wavelength conversion structure or a display panel including the wavelength conversion structure includes
providing a base structure including a partition wall to define a first space and a second space,
preparing a first ink composition, and a second ink composition, including first quantum dots and second quantum dots, respectively, dispersed in a liquid vehicle,
depositing the first ink composition into the first space;
depositing the second ink composition into the second space; and
polymerizing the deposited first ink composition, and the deposited second ink composition, to form the first quantum dot composite in the first space and the second quantum dot composite in the second space, respectively.

The first ink composition has a viscosity of less than about 4.6 centipoise (cps) or less than or equal to about 4.5 centipoise. The second ink composition may have a viscosity of less than about 4.6 centipoise or less than or equal to about 4.5 centipoise. A contact angle of the first ink composition with respect to a silicon substrate is greater than or equal to about 20 degrees, and less than or equal to about 40 degrees, e.g., about 38 degrees, about 35 degrees or 30 degrees. A contact angle of the second ink composition with respect to a silicon substrate may be greater than or equal to about 18 degrees, or greater than or equal to about 20 degrees and less than or equal to about 40 degrees, e.g., about 38 degrees, about 35 degrees or 30 degrees.

The viscosity of the (first or second) ink composition may be greater than or equal to about 3.5 cps.

In an embodiment, in the first ink composition, the first quantum dots may be present in an amount of greater than or equal to about 10 wt %, based on the total solid content of the first ink composition. In the second ink composition, the second quantum dots may be present in an amount of greater than or equal to about 10 wt %, based on the total solid content of the second ink composition, Based on a total weight of the (first or second) composition, a total solid content of the (first or second) ink composition is less than or equal to about 24 wt %.

The (first or second) ink composition may further include metal oxide fine particles. In the composition, an amount of the metal oxide fine particles may be less than or equal to about 5 wt %, based on the total solid content of the composition.

The ink composition may have a total solid content (and/or an amount and/or a type of each component) that is controlled so the composition may satisfy the viscosity and the contact angle values in the ranges recited herein. The ink composition of the embodiment may satisfy the features recited herein (e.g., the recited viscosity) and may exhibit an improved hydrophilicity or an improved affinity, for example, toward a silicon substrate.

In an embodiment, the quantum dots and other components may be combined in order to control properties therebetween (e.g., a hydrophobicity and/or hydrophilicity), and thus, in its entirety, the resulting composition may possess the recited properties (e.g., the contact property and/or the viscosity), whereby the ink composition may be readily disposed in the space defined by the partition wall, and having a given form (e.g., a trench or via hole) during a pattern forming process.

In an embodiment, the total solid content of the (first or second) ink composition may be less than or equal to about 24 wt %, less than or equal to about 23 wt %, less than or equal to about 22 wt %, less than or equal to about 21 wt %, or less than or equal to about 20 wt %, based on a total weight of the composition. The total solid content of the (first or second) ink composition may be greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, based on the total weight of the composition. The total solid content of the ink composition may be from about 10 wt % to about 24 wt %, from about 15 wt % to about 23.5 wt %, from about 20 wt % to about 23.3 wt %, or from about 21.5 wt % to about 23.2 wt %, or any combination thereof, based on a total weight of the composition.

In a composition of an embodiment, the quantum dots may be present in an amount of greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, greater than or equal to about 20 wt %, greater than or equal to about 21 wt %, greater than or equal to about 22 wt %, greater than or equal to about 22.5 wt %, greater than or equal to about 23 wt %, or greater than or equal to about 24 wt %, based on a total solid content of the composition. In a composition of an embodiment, the quantum dots may be present in an amount of less than or equal to about 30 wt %, less than or equal to about 29 wt %, less than or equal to about 28 wt %, less than or equal to about 27 wt %, less than or equal to about 26 wt %, less than or equal to about 25 wt %, less than or equal to about 24 wt %, less than or equal to about 23.5 wt %, less than or equal to about 22 wt %, less than or equal to about 20 wt %, or less than or equal to about 19 wt %, based on a total solid content of the composition. The amount of the quantum dots may be, based on a total solid content of the composition, from about 10 wt % to about 30 wt %, from about 12 wt % to about 27 wt %, from about 14 wt % to about 26 wt %, from about 16 wt % to about 25 wt %, from about 18 wt % to about 24 wt %, or from about 20 wt % to about 23 wt %, or any combination thereof.

In an embodiment, by controlling the solid content of the (first or second) ink composition and the amount of the quantum dots, the resulting composition may have the viscosity in a range recited herein. The viscosity of the composition may be less than or equal to about 4.5 cps, less than or equal to about 4.4 cps, less than or equal to about 4.3 cps, less than or equal to about 4.2 cps, or less than or equal to about 4.1 cps. The viscosity of the composition may be greater than or equal to about 3.0 cps, greater than or equal to about 3.5 cps, greater than or equal to about 3.8 cps, greater than or equal to about 4.0 cps, The viscosity of the (first or second) ink composition may be from about 3.0 cps to about 4.5 cps, from about 3.5 cps to about 4.3 cps, 3.8 cps to about 4.2 cps, or from about 4.0 cps to about 4.1 cps, or any combination thereof.

In an embodiment, the viscosity may be a shear viscosity. In an embodiment, the viscosity may be measured at room temperature (e.g., from about 20° C. to 30° C., for example, 20° C., 21° C., 22° C., 23° C., 24° C., 25° C., to 30° C.). In an embodiment, the viscosity may be readily and reproducibly measured by using any commercially available viscometer (e.g., a RheoStress type viscometer available from Thermo Scientific).

In an embodiment, the ink composition may exhibit a contact angle recited herein together with the viscosity. In an embodiment, the ink composition may have a contact angle, as measured by a ring or circle method on a silicon substrate, that is less than or equal to about 40 degrees, less than or equal to about 38 degrees, less than or equal to about 37 degrees, less than or equal to about 36 degrees, less than or equal to about 35 degrees, less than or equal to about 34 degrees, less than or equal to about 33 degrees, less than or equal to about 32 degrees, less than or equal to about 31 degrees, less than or equal to about 30 degrees, less than or equal to about 29 degrees, less than or equal to about 28 degrees, less than or equal to about 27 degrees, less than or equal to about 26 degrees, less than or equal to about 25 degrees. The contact angle may be greater than about 18 degrees, greater than or equal to about 19 degrees, greater than or equal to about 20 degrees. The contact angle may be from about 20 degrees to about 40 degrees, from about 25 degrees to about 35 degrees, from about 27 degrees to about 34 degrees, from about 28 degrees to about 33 degrees, or any combined range recited herein.

Figure 2:
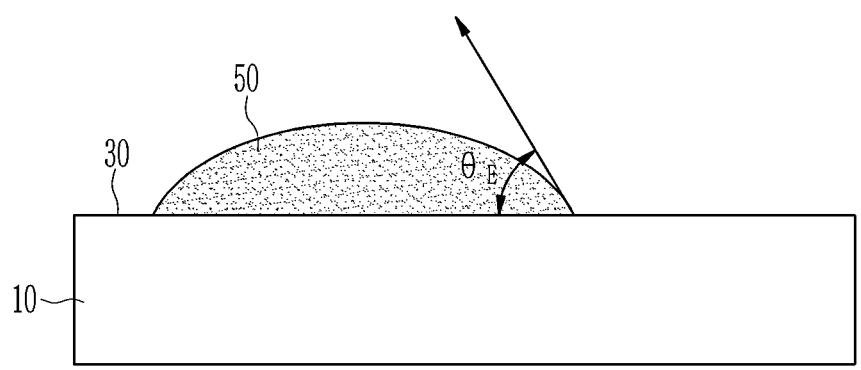
FIG. 2 illustrates a measurement of a contact angle for a composition of an embodiment.

In an embodiment, the contact angle is a measured angle on a predetermined substrate illustrated in FIG. 2. The contact angle may be measured in a ring method or a circle method for example at room temperature. FIG. 2 shows a contact angle $\theta_E$ of a liquid drop 50 of a composition disposed on a surface 30 of a given substrate 10. The contact angle may be readily and reproducibly determined by using a commercially available measuring apparatus e.g., contact angle measurement equipment of KRUSS Co., Ltd.

In the ink composition or the composite of an embodiment, the (first, second, or third) quantum dot(s) (hereinafter also referred to as a semiconductor nanocrystal particle) may include a Group II-VI compound, a Group III-V compound, a Group IV-VI compound, a Group IV element or compound, a Group I-III-VI compound, a Group I-II-IV-VI compound, or a combination thereof.

The Group II-VI compound may be selected from:
  a binary element compound selected from CdSe, CdTe, ZnS, ZnSe, ZnTe, ZnO, HgS, HgSe, HgTe, MgSe, MgS, and a combination thereof;

a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group II-VI compound may further include a Group III metal.

The Group III-V compound may be selected from:

a binary element compound selected from GaN, GaP, GaAs, GaSb, AN, AlP, AlAs, AlSb, InN, InP, InAs, InSb, and a combination thereof;

a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, InZnP, and a combination thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group III-V compound may further include a Group II metal (e.g., InZnP).

The Group IV-VI compound may be selected from:

a binary element compound selected from SnS, SnSe, SnTe, PbS, PbSe, PbTe, and a combination thereof;

a ternary element compound selected from SnSeS, SnSeTe, SnSTe, PbSeS, PbSeTe, PbSTe, SnPbS, SnPbSe, SnPbTe, and a combination thereof; and a quaternary element compound selected from SnPbSSe, SnPbSeTe, SnPbSTe, and a combination thereof.

Examples of the Group I-III-VI compound may include $CuInSe_2$, $CuInS_2$, CuInGaSe, and CuInGaS, but are not limited thereto.

Examples of the Group I-II-IV-VI compound may include CuZnSnSe and CuZnSnS, but are not limited thereto.

The Group IV element or compound may include:

an elementary substance selected from Si, Ge, and a combination thereof; and a binary element compound selected from SiC, SiGe, and a combination thereof.

The binary element compound, the ternary element compound or the quaternary element compound may be respectively included in a uniform concentration or in partially different concentrations within the same particle.

The quantum dot or the semiconductor nanocrystal particle may have a core-shell structure, wherein a first semiconductor nanocrystal (a core) is surrounded by a second semiconductor nanocrystal (a shell) that is different from the first semiconductor nanocrystal.

At the interface between the core and the shell, an alloy interlayer may be present or may not be present. When the quantum dot has an alloy interlayer, the interface between the core and the shell may have a concentration gradient, wherein the concentration of an element of the shell changes (e.g., decreases or increases) toward the core. In addition, the shell may include a multi-layered shell having at least two (e.g., 3, 4, 5, or greater) layers.

In an embodiment, the shell may be a multi-layered shell including two or more layers. In the multi-layered shell, adjacent two layers may have different compositions from each other. In the multi-layered shell, at least one layer may independently include a semiconductor nanocrystal having a single composition. In the multi-layered shell, at least one layer may independently have an alloyed semiconductor nanocrystal. In the multi-layered shell, at least one layer may have a concentration gradient that radially changes in terms of a composition of a semiconductor nanocrystal.

In an embodiment, at least one layer may include least two materials. In an embodiment, a layer may include a gradient alloy with gradient concentration of the alloy materials. The gradient alloy may have a radially changing concentration gradation. In an embodiment, the layer including at least two materials may have a homogeneous composition (e.g., a homogenous alloy for example, with no gradient).

In the core shell quantum dot, the materials of the shell may have a bandgap energy that is different from the materials of the core. In an embodiment, the bandgap energy of the shell material may be larger than that of the core material, but it is not limited thereto. The materials of the shell may have a bandgap energy that is smaller than that of the core. In the case of the multi-layered shell, the bandgap energy of the outermost layer material of the shell may be greater (or smaller) than those of the core material and the inner layer material of the shell or the materials of the shell layers that are closer to the core.

Absorption or emission peak wavelength of the quantum dot may be controlled by changing the composition and/or the size of the quantum dot.

A luminescent peak wavelength of the quantum dot may be greater than or equal to about 460 nm, greater than or equal to about 490 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, greater than or equal to about 610 nm, greater than or equal to about 620 nm, greater than or equal to about 630 nm, greater than or equal to about 640 nm, greater than or equal to about 650 nm, or greater than or equal to about 700 nm. A (maximum) luminescent peak wavelength of the quantum dot may be less than or equal to about 750 nm, less than or equal to about 730 nm, less than or equal to about 720 nm, less than or equal to about 710 nm, less than or equal to about 700 nm, less than or equal to about 690 nm, less than or equal to about 680 nm, less than or equal to about 670 nm, less than or equal to about 660 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, less than or equal to about 540 nm, less than or equal to about 530 nm, less than or equal to about 520 nm, less than or equal to about 510 nm, or less than or equal to about 500 nm.

The quantum efficiency or quantum yield of the quantum dot(s) may be greater than or equal to about 10%, greater than or equal to about 20%, greater than or equal to about 30%, greater than or equal to about 50%, greater than or equal to about 60%, greater than or equal to about 70%, greater than or equal to about 90%, or equal to about 100%. For the improved color purity and color reproducibility, the quantum dot may have a relatively narrow spectrum. A luminescent peak of the quantum dots may have a full width at half maximum of less than or equal to about 50 nm, less than or equal to about 45 nm, less than or equal to about 40 nm, or less than or equal to about 30 nm.

The quantum dot may have a particle size of about 1 nm to about 100 nm. The quantum dot may have a particle size of about 1 nm to about 50 nm. The (average) size of the quantum dot may be greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, or greater than or equal to about 10 nm. The (average) size of the quantum dot may be less than or equal to about 50 nm, less than or equal to about 40 nm, less than or equal to about 30 nm, less than or equal to about 20 nm, less than or equal to about 15 nm, less than or equal to about 14 nm, less than or equal to about 13 nm, less than or equal to about 12 nm, less than or equal to about 11 nm, or less than or equal to about 10 nm.

In an embodiment, the size of the quantum dot may be a nominal size that can be calculated from an inductively coupled plasma atomic emissive spectroscopy analysis. In an embodiment, the size of the quantum dot may be a size (e.g., an average size) obtained from a two-dimensional image of an electron microscopy analysis (e.g., under an assumption of a circle). In an embodiment, "a size" may refer to a size of a single quantum dot or a (e.g., a mean or a median) average of quantum dots or a population of the quantum dots. A size of the quantum dot(s) may be determined by using a result (e.g., an image) of a (transmission) electron microscopy analysis and any suitable image analysis computer program (e.g., Image J).

A shape of the quantum dot is not particularly limited. For example, the quantum dot may have a spherical shape, an ellipsoidal shape, a polyhedron shape, a pyramidal shape, a multi pod shape, a cubic shape, a cuboid shape, a nanotube shape, a nanowire shape, a nanofiber shape, a nanoplate shape, or a combination thereof, which are not limited thereto.

The quantum dot is commercially available or may be synthesized by any method. For example, several nano-sized quantum dots may be synthesized by a wet chemical process. In the wet chemical process, precursors react in an organic solvent to grow semiconductor nanocrystal particles, and the organic solvent or a ligand compound may coordinate (or be bound) to the surface of the semiconductor nanocrystal particles, thereby controlling the growth of the nanocrystal. Examples of the organic solvent and the ligand compound are known in the art. After the synthesis, an excess amount of organic materials that are not coordinated to the surface of the quantum dot may be removed by pouring the quantum dot into an excessive amount of a non-solvent, and centrifuging the resulting mixture. Examples of the non-solvent may be acetone, ethanol, methanol, and the like, but are not limited thereto.

In an embodiment, the quantum dot may include an organic ligand e.g., on a surface thereof. The organic ligand may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, RHPOOH, R$_2$POOH, a polymeric organic ligand, or a combination thereof wherein R and R' are the same or different, and are independently a substituted or unsubstituted C1 to C40 (e.g., a C3 to C30 or a C6 to C24) aliphatic hydrocarbon group (e.g., alkyl, alkenyl, or alkynyl group) or a substituted or unsubstituted C6 to C40 aromatic hydrocarbon group (e.g., a C6 to C20 aryl), or a combination thereof.

The organic ligand may coordinate to, e.g., be bound to, the surface of the quantum dot, helping the nanocrystal to be well dispersed in the solution. The organic ligand may have an effect on a luminous or an electrical property of the quantum dot.

The organic ligand may coordinate to, e.g., be bound to, the surface of the quantum dot, helping the semiconductor nanocrystal particles to be well dispersed in the solution. Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methylphosphine (e.g., trimethylphosphine, methyldiphenylphosphine, etc.), a substituted or unsubstituted ethylphosphine (e.g., triethylphosphine, ethyldiphenylphosphine, etc.), a substituted or unsubstituted propylphosphine, a substituted or unsubstituted butylphosphine, a substituted or unsubstituted pentylphosphine, or a substituted or unsubstituted octylphosphine (e.g., trioctylphosphine (TOP)); a phosphine oxide such as a substituted or unsubstituted methylphosphine oxide (e.g., trimethylphosphine oxide, methyldiphenylphosphine oxide, etc.), a substituted or unsubstituted ethylphosphine oxide (e.g., triethylphosphine oxide, ethyldiphenylphosphine oxide, etc.), a substituted or unsubstituted propylphosphine oxide, a substituted or unsubstituted butylphosphine oxide, or a substituted or unsubstituted octylphosphine oxide (e.g., trioctylphosphine oxide (TOPO)); diphenylphosphine, diphenylphosphine oxide, triphenylphosphine, or triphenylphosphine oxide; a mono- or di(C5 to C20 alkyl) phosphinic acid such as a mono- or dihexylphosphinic acid, a mono- or dioctylphosphinic acid, a mono- or di(dodecyl)phosphinic acid, a mono- or di(tetradecyl)phosphinic acid, a mono- or di(hexadecyl)phosphinic acid, a mono- or di(octadecyl)phosphinic acid, or a combination thereof; a C5 to C20 alkylphosphinic acid; a C5 to C20 alkylphosphonic acid such as hexylphosphonic acid, octylphosphonic acid, dodecylphosphonic acid, tetradecylphosphonic acid, hexadecylphosphonic acid, octadecylphosphonic acid, or a combination thereof; or a combination thereof, and the like, but are not limited thereto. Two or more different organic ligand compound may be used.

The organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctylphosphine) substituted with a, e.g., at least one (e.g., 1, 2, or 3), C6 to C22 alkyl group, a phosphine oxide (e.g., trioctylphosphine oxide) substituted with a, e.g., at least one (e.g., 1, 2, or 3), C6 to C22 alkyl group, a C12 to C22 aromatic ether such as a phenyl ether or a benzyl ether, or a combination thereof. Types and amounts of the solvent may be selected appropriately taking into consideration the precursors and the organic ligands as used.

The composition may further include metal oxide fine particle(s), as described herein. The metal oxide fine particles may include $TiO_2$, $SiO_2$, $BaTiO_3$, $Ba_2TiO_4$, ZnO, or a combination thereof. The metal oxide fine particle may be non-emissive (e.g., not emitting light). The metal oxide may include an oxide of a metal or a metalloid. The metal oxide fine particle(s) may have an appropriately selected diameter (or average diameter) without a particular limit. The (average) diameter of the metal oxide fine particle(s) may be greater than or equal to about 100 nm, for example, greater than or equal to about 150 nm, or greater than or equal to about 200 nm and less than or equal to about 1,000 nm or less than or equal to about 800 nm.

In a composition of an embodiment, the metal oxide fine particle(s) may be present in an amount of less than or equal to about 5 wt %, less than or equal to about 4 wt %, less than or equal to about 3 wt %, less than or equal to about 2 wt %, or less than or equal to about 1.75 wt %, based on a total solid content of the composition. The metal oxide fine particles may be present in an amount of greater than or equal to about 0.5 wt %, greater than or equal to about 0.75 wt %, greater than or equal to about 1.0 wt %, greater than or equal to about 1.25 wt %, or greater than or equal to about 1.5 wt %, based on a total solid content of the composition. In a composition, an amount of the metal oxide fine particle(s) may be from about 0.5 wt % to about 5 wt %, from about 0.75 wt % to about 4 wt %, from about 1.0 wt % to about 3 wt %, from about 1.25 wt % to about 2 wt %, from about 1.5 wt % to about 1.75 wt %, or a combined range thereof, based on a total solid content of the composition.

The composition may further include a dispersing agent, an initiator, or a combination thereof. The liquid vehicle may include a polymerizable monomer (e.g., a photo-polymerizable monomer) having a carbon-carbon double bond, an organic solvent, or a combination thereof.

The dispersing agent or the binder may be for dispersing the quantum dots, and if present, the metal oxide fine particles. The dispersing agent may be a carboxylic acid group-containing compound. The dispersing agent may be a monomer or a polymer.

The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;
 a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or
 a combination thereof.

The copolymer may include a first repeating unit derived from the first monomer, a second repeating unit derived from the second monomer, and optionally a third repeating unit derived from the third monomer.

Examples of the first monomer may include, but are not limited to, acrylic acid, methacrylic acid, maleic acid, itaconic acid, fumaric acid, 3-butenoic acid, carboxylic acid vinyl ester compounds such as vinyl acetate, and vinyl benzoate. The first monomer may include one or more compounds.

Examples of the second monomer may include, but are not limited to:

alkenyl aromatic compounds such as styrene, α-methyl styrene, vinyl toluene, or vinyl benzyl methyl ether;
 unsaturated carboxylic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate;
 unsaturated carboxylic acid amino alkyl ester compounds such as 2-amino ethyl acrylate, 2-amino ethyl methacrylate, 2-dimethyl amino ethyl acrylate, or 2-dimethyl amino ethyl methacrylate;
 maleimides such as N-phenylmaleimide, N-benzylmaleimide, N alkylmaleimide;
 unsaturated carboxylic acid glycidyl ester compounds such as glycidyl acrylate or glycidyl methacrylate;
 vinyl cyanide compounds such as acrylonitrile or methacrylonitrile; and
 unsaturated amide compounds such as acrylamide or methacrylamide,
 but are not limited thereto.

As the second monomer, at least one compound may be used.

Examples of the third monomer may include 2-hydroxy ethyl acrylate, 2-hydroxy ethyl methacrylate, 2-hydroxy butyl acrylate, and 2-hydroxy butyl methacrylate, but are not limited thereto. The third monomer may include one or more compounds.

In the carboxylic acid group containing polymer, an amount of the first repeating unit derived from the first monomer may be greater than or equal to about 10 mole percent (mol %), for example, greater than or equal to about 15 mol %, greater than or equal to about 25 mol %, or greater than or equal to about 35 mol %. In the binder polymer (i.e., the carboxylic acid group containing polymer), an amount of the first repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 35 mol %, or less than or equal to about 25 mol %.

In the carboxylic acid group containing polymer, an amount of the second repeating unit derived from the second monomer may be greater than or equal to about 10 mol %, for example, greater than or equal to about 15 mol %, greater than or equal to about 25 mol %, or greater than or equal to about 35 mol %. In the binder polymer, an amount of the second repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 40 mol %, less than or equal to about 35 mol %, or less than or equal to about 25 mol %.

If present, an amount of the third repeating unit derived from the third monomer in the carboxylic acid group containing polymer may be greater than or equal to about 1 mol %, for example, greater than or equal to about 5 mol %, greater than or equal to about 10 mol %, or greater than or equal to about 15 mol %. In the binder polymer, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

In an embodiment, the carboxylic acid group containing polymer may be a copolymer of (meth)acrylic acid (i.e., the first monomer) and at least one second or third monomer selected from aryl or alkyl(meth)acrylate, hydroxyalkyl (meth)acrylate, and styrene. For example, the binder polymer may include a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

The multiple aromatic ring-containing polymer are known in the art as a cardo binder and commercially available.

The binder polymer may have an acid value of greater than or equal to about 50 milligrams of KOH per gram of the polymer (mg KOH/g). For example, the binder polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The binder polymer (i.e., carboxylic acid group containing polymer) may have an acid value of, for example, less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, less than or equal to about 170 mg KOH/g, or less than or equal to about 160 mg KOH/g, but it is not limited thereto.

The binder polymer may have a weight average molecular weight of greater than or equal to about 1000 g/mol, for example, greater than or equal to about 2000 g/mol, greater than or equal to about 3000 g/mol, or greater than or equal to about 5000 g/mol.

In a composition, the content of the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on a total weight (or total solid content) of the composition, but is not limited thereto. The content of the binder polymer may be less than or equal to about 55 wt %, for example less than or equal to about 40 wt %, less than or equal to about 30 wt %, less than or equal to about 33 wt %, or less than or equal to about 30 wt % based on a total weight (or total solid content) of the composition.

In a composition, the polymerizable (e.g., photopolymerizable) monomer (hereinafter, may be referred to as "monomer") including the carbon-carbon double bond may include a (e.g., photopolymerizable) (meth)acryl-based, i.e., (meth)acryl-containing, monomer. The monomer may be a precursor for an electrically insulating polymer.

The monomer may include alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof.

An amount of the monomer may be greater than or equal to about 0.5 wt %, greater than or equal to about 1 wt %, greater than or equal to about 2 wt %, greater than or equal to about 10 wt %, greater than or equal to about 15 wt %, or greater than or equal to about 20 wt %, based on a total solid content or a total weight of the composition. An amount of the monomer may be less than or equal to about 60 wt %, less than or equal to about 40 wt %, less than or equal to about 20 wt %, less than or equal to about 19 wt %, less than or equal to about 18 wt %, less than or equal to about 17 wt %, less than or equal to about 16 wt %, less than or equal to about 15 wt %, less than or equal to about 14 wt %, less than or equal to about 13 wt %, less than or equal to about 12 wt %, less than or equal to about 11 wt %, or less than or equal to about 10 wt %, based on a total solid content or a total weight of the composition.

The (photo)initiator included in the composition is a compound that initiates (photo)polymerization of the aforementioned monomers in the composition. The initiator is a compound accelerating a radical reaction (e.g., radical polymerization of monomer) by producing radical chemical species under a mild condition (e.g., by heat or light). The initiator may be a thermal initiator or a photoinitiator. Types of the initiator are not particularly limited and may be appropriately selected.

In an embodiment, the thermal initiator may include azobis(isobutyronitrile), benzoyl peroxide, or a combination thereof. In an embodiment, the available photoinitiator may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, or a combination thereof, but it is not limited thereto.

In the composition, an amount of the initiator may be appropriately adjusted taking into consideration the type and the amount of the polymerizable monomer and the total solid content of the composition.

In an embodiment, the amount of the initiator may be greater than or equal to about 0.01 wt %, for example, greater than or equal to about 1 wt % and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight (or a total solid content) of the composition, but is not limited thereto.

The composition may further include the poly- or monothiol compound having at least one thiol group for example at a terminal end thereof.

The polythiol compound may include a compound represented by Chemical Formula 1:

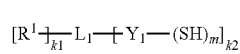

Chemical Formula 1 wherein,

R$^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C3 to C30 heterocycloalkyl group, a substituted or unsubstituted C1 to C10 alkoxy group, a hydroxy group, —$NH_2$, a substituted or unsubstituted C1 to C30 amine group (—NRR', wherein R and R' are independently hydrogen or a substituted or unsubstituted C1 to C30 linear or branched alkyl group, provided that R and R' are not hydrogen simultaneously), an isocyanate group, a halogen, —ROR' (wherein R is a substituted or unsubstituted C1 to C20 alkylene group and R' is hydrogen or a substituted or unsubstituted C1 to C20 linear or branched alkyl group), an acyl halide (—RC(=O)X, wherein R is a substituted or unsubstituted C1 to C20 alkylene group and X is a halogen), —C(=O)OR' (wherein R' is hydrogen or a substituted or unsubstituted C1 to C20 linear or branched alkyl group), —CN, —C(=O)NRR' (wherein R and R' are independently hydrogen or a substituted or unsubstituted C1 to C20 linear or branched alkyl group), —C(=O)ONRR' (wherein R and R' are independently hydrogen or a C1 to C20 linear or branched alkyl group) or a combination thereof, $L_1$ is a carbon atom, a substituted or unsubstituted C1 to C30 alkylene group, a substituted or unsubstituted C2 to C30 alkylene group wherein at least one methylene (—$CH_2$—) is replaced with sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a substituted or unsubstituted C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_1$ is a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a substituted or unsubstituted C1 to C10 linear or branched alkyl group), imine (—NR—) (wherein R is hydrogen or a substituted or unsubstituted C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more.

In an embodiment, the m does not exceed the valence of $Y_1$ when $Y_1$ is not a single bond. The sum of k1 and k2 does not exceed the valence of $L_1$.

The thiol compound may include a compound of Chemical Formula 1-1:

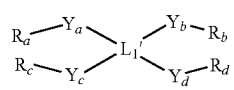

Chemical Formula 1-1 wherein $L_1'$ is carbon, a substituted or unsubstituted C2 to C20 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, each of $Y_a$ to $Y_d$ is independently a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a substituted or unsubstituted C1 to C10 linear or branched alkyl group), imine (—NR—) (wherein R is hydrogen or a substituted or unsubstituted C1 to C10 linear or branched alkyl group), or a combination thereof, and each of $R_a$ to $R_d$ is $R^1$ of Chemical Formula 2 or SH, provided that at least two of $R_a$ to $R_d$ are SH.

The polythiol compound may be a dithiol compound, a trithiol compound, a tetrathiol compound, or a combination thereof. For example, the polythiol thiol compound may be glycoldi-3-mercaptopropionate (e.g., ethylenenglycoldi-3-mercaptopropionate), glycol di-mercaptoacetate (e.g., ethyleneglycol di-mercaptoacetate), trimethylolpropane-tris (3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

In the composition, if present, an amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight or a total solid content of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt %, based on a total weight or a total solid content of the composition.

The liquid vehicle may include an organic solvent, the type of which is not particularly limited. The type and the amount of the organic solvent may be appropriately selected by taking into consideration the aforementioned main components (i.e., the quantum dot, the dispersing agent, the photopolymerizable monomer, the photoinitiator, and if used, the thiol compound), and types and amounts of additives which will be described herein. The composition may include a solvent in a residual amount except for a desired amount of the (total) solid content (for example, non-volatile components).

Examples of the organic solvent may include, but are not limited to: ethyl 3-ethoxy propionate; an ethylene glycol series such as ethylene glycol, diethylene glycol, or polyethylene glycol; a glycol ether series such as ethylene glycol monomethyl ether, ethylene glycol monoethyl ether, diethylene glycol monomethyl ether, ethylene glycol diethyl ether, or diethylene glycol dimethyl ether; glycol ether acetates series such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether series such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate series such as propylene glycol monomethyl ether acetate or dipropylene glycol monoethyl ether acetate; an amide series such as N-methylpyrrolidone, dimethyl formamide, or dimethyl acetamide; a ketone series such as methyl ethyl ketone (MEK), methyl isobutyl ketone (MIBK), or cyclohexanone; a petroleum product such as toluene, xylene, or solvent naphtha; an ester series such as ethyl acetate, propyl acetate, butyl acetate, cyclohexyl acetate, or ethyl lactate; an ether such as diethyl ether, dipropyl ether, or dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

In the (ink) composition of an embodiment, an amount of the solvent may be greater than or equal to about 50 wt %, greater than or equal to about 55 wt %, greater than or equal to about 60 wt %, greater than or equal to about 65 wt %, greater than or equal to about 70 wt %, greater than or equal to about 75 wt %, greater than or equal to about 80 wt %, greater than or equal to about 81 wt %, greater than or equal to about 83 wt %, greater than or equal to about 84 wt %, greater than or equal to about 85 wt %, greater than or equal to about 86 wt %, or greater than or equal to about 87 wt %, based on a total weight of the composition. In the composition, an amount of the solvent may be less than or equal to about 99 wt %, less than or equal to about 95 wt %, less than or equal to about 90 wt %, or less than or equal to about 87 wt %, based on a total weight of the composition. In the composition of an embodiment, a total solid content may be a weight of components constituting the composition except for the solvent.

In addition to the aforementioned components, the composition of an embodiment may further include various additives such as a leveling agent, or a coupling agent, if desired. An amount of the additive is not particularly limited, and may be selected within an appropriate range, wherein the additive does not cause an adverse effect on the preparation of the composition, the preparation of the quantum dot composite, and optionally, the patterning of the composite.

If present, the amount of the additives may be, based on a total weight of the composition (or a total solid content of the composition), greater than or equal to about 0.1 wt %, for example, greater than or equal to about 0.5 wt %, greater than or equal to about 1 wt %, greater than or equal to about 2 wt %, or greater than or equal to about 5 wt %, but it is not limited thereto. If present, based on a total weight of the composition (or a total solid content of the composition), the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, but it is not limited thereto.

The composition according to an embodiment may be prepared by a method including preparing quantum dot dispersion including the aforementioned quantum dots, dispersing agent, and solvent; and mixing the quantum dot dispersion with the initiator, the polymerizable monomer (e.g., an acryl-based, i.e., acryl-containing, monomer), optionally, the thiol compound, optionally, the metal oxide particulates, and optionally, the aforementioned additive. Each of the aforementioned components may be mixed sequentially or simultaneously, but mixing orders are not particularly limited. The composition according to an embodiment may be used to provide a quantum dot composite pattern (e.g., a patterned quantum dot polymer composite. The composition may provide a quantum dot-polymer composite by a (e.g., radical) polymerization.

In an embodiment, the production of the wavelength conversion structure may involve the use of the aforementioned ink composition (having the recited components and showing the recited properties such as the viscosity and the contact angle). As mentioned above, in the production method of the embodiment, the base structure having the partition wall to define the (first, second, and optionally third) space to have the dimensions recited herein is provided and the composition is loaded or deposited in the space. Unlike the conventional composition, the composition of the embodiment may readily and reproducibly fill the space (e.g., most of the volume space) of the base structure.

The method may further include curing (i.e., polymerizing) the composition loaded in the space. The method may further include removing the uncured (or unpolymerized) composition from the base structure.

The manner of depositing (e.g., loading, hereinafter, simply referred to "loading") the composition may include a drop casting, a spin coating, a dip coating, a spray coating, a flow coating, a screen printing, or a combination thereof.

In an embodiment, the loading of the composition may include the spin coating wherein a substrate to be coated is spun at a predetermined speed (e.g., from about 300 rpm to about 5000 rpm) for a predetermined time (e.g., about 15 seconds to about 2 minutes). The spin coating may be carried out once or repeated up to 20 times.

In an embodiment, the composition may be applied to the substrate by a spraying manner. In an embodiment, the spaying may readily fill the space of the structure recited herein.

The spraying manner may be carried out using a commercially available or any known suitable apparatus (for example, a dual spray coater from Eplex Co., Ltd.). In the spraying, a spraying pressure may be less than or equal to about 10 pounds per square inch (psi), less than or equal to about 9 psi, less than or equal to about 8 psi, less than or equal to about 7 psi, less than or equal to about 6 psi, and greater than or equal to about 1 psi, greater than or equal to about 2 psi, greater than or equal to about 3 psi, greater than or equal to about 4 psi, greater than or equal to about 5 psi, or greater than or equal to about 6 psi, for example, the spraying pressure may be from about 1 psi to about 10 psi, from about 2 psi to about 9 psi, from about 3 psi to about 8 psi, from about 4 psi to about 7 psi, or from about 5 psi to about 6 psi, but is not limited thereto. In the spraying, a transporting speed may be less than or equal to about 100 millimeters per second (mm/s), less than or equal to about 90 mm/s, less than or equal to about 80 mm/s, less than or equal to about 70 mm/s, or less than or equal to about 60 mm/s, and greater than or equal to about 1 mm/s, greater than or equal to about 10 mm/s, greater than or equal to about 20 mm/s, greater than or equal to about 30 mm/s, greater than or equal to about 40 mm/s, greater than or equal to about 50 mm/s, or greater than or equal to about 60 mm/s, for example, the transporting speed may be from about 1 mm/s to about 100 mm/s, from about 10 mm/s to about 90 mm/s, from about 20 mm/s to about 80 mm/s, from about 30 mm/s to about 70 mm/s, or from about 40 mm/s to about 60 mm/s.

In an embodiment, when the spray coating manner is used, the part to be coated may be heated at a predetermined temperature. The temperature of the part to be coated may be from about 0° C. to about 200° C. The spraying time may be from about 5 seconds to about 2 hours.

The space (or the spaces) may be filled with the composition and the selected area may be exposed to light (of a wavelength of less than or equal to about 400 nm). The exposure to light may be carried out using a photomask having a predetermined pattern and the wavelength and the intensity of the light may be selected considering the type and the amount of the initiator, and the amount and the type of the quantum dots.

In an embodiment, the structure having the ink composition loaded or deposited in the space may be subjected to a pre-baking (PRB) process. A time and a temperature for the pre-baking process is not particularly limited and selected appropriately. The pre-baking process may be carried out at a temperature of from about 50° C. to about 150° C. for a time period of about 1 minute and 50 minutes.

In an embodiment, the exposed structure may undergo a developing process for removing the un-exposed portion of the structure. The developing process may use an alkaline developing liquid. The exposed structure may be treated with the alkaline developing liquid for example (by dipping or spraying), and this may facilitate the removal of a composition on the un-exposed area (e.g., the upper-most surface of the partition wall).

The obtained structure having the quantum dot composite disposed in the space may be, optionally, post-baked (POB) to improve crack resistance and solvent resistance of the pattern, for example, at a temperature of greater than or equal to about 150° C., for example, greater than or equal to about 180° C. and less than or equal to about 230° C., for example, less than or equal to about 200° C. for a predetermined time (e.g., greater than or equal to about 10 minutes or greater than or equal to about 20 minutes).

The display panel (e.g., a layered structure including the wavelength conversion structure) may include a light emitting element (for example, having a plurality of light emitting units) to provide a color conversion region (e.g., the quantum dot composite or the wavelength conversion structure) with the incident light. The color conversion region may be disposed on the light emitting element so that the quantum dot composite of the wavelength conversion structure may be overlapped with the light emitting unit. In an embodiment, a display device or an electronic apparatus may include the layered structure or the display panel.

Hereinafter, a display panel or a layered structure 100 in an embodiment and a display device 1 including the same are described with reference to FIGS. 3 to 5A and 5B.

Figure 3:
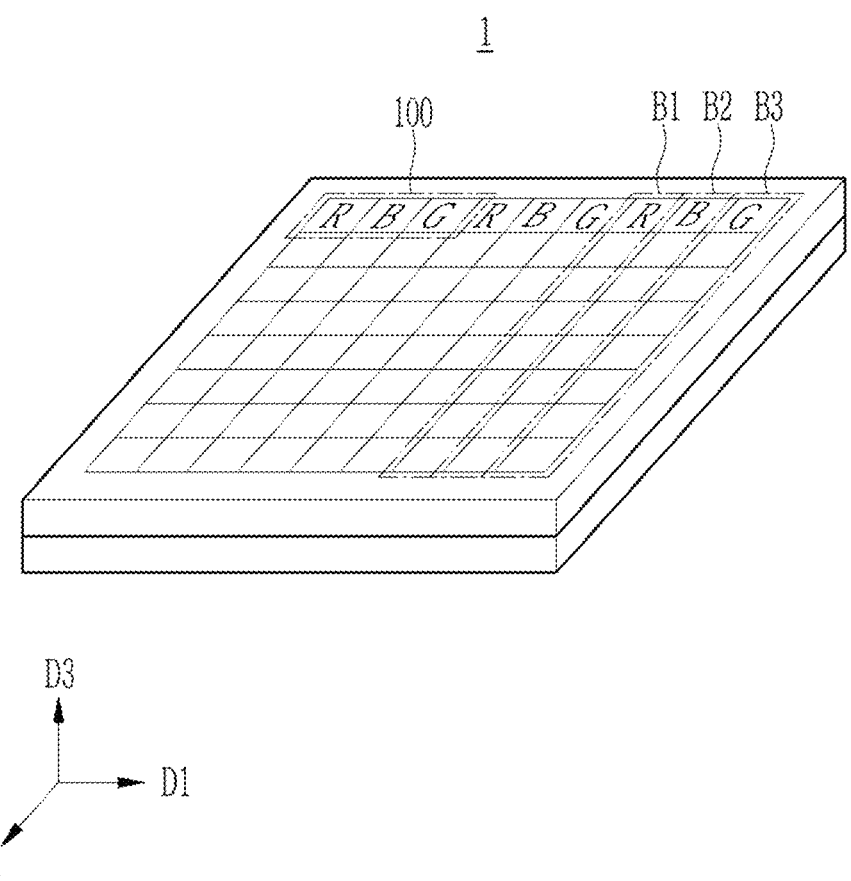
FIG. 3 is a perspective view of a display panel, for example, showing a pixel pattern.
Figure 4:
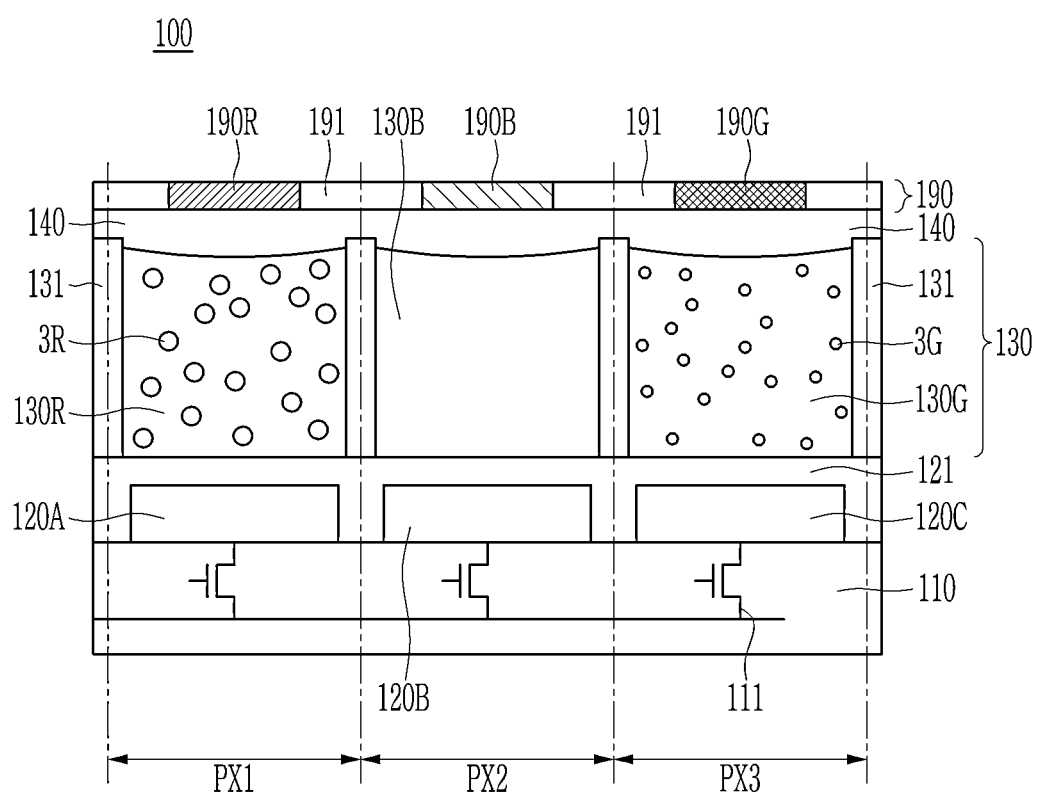
FIG. 4 is a schematic cross-section view of a display panel including a color conversion region and a light emitting element of an embodiment.

FIG. 3 is a schematic perspective view of an embodiment of a display device 1 and FIG. 4 is a schematic cross-sectional view of an embodiment of a display panel 100.

Referring to FIG. 3, a display device 1 in an embodiment includes a layered structure or a display panel 100, and the display panel 100 may selectively emit red light R, green light G, or blue light B. In an embodiment, the display panel 100 may include three pixel areas, e.g., a red pixel area R, green pixel area G, and blue pixel area B.

In an embodiment, a plurality of red pixel areas R arranged along the direction D2 may emit the same color, for example. In an embodiment, a plurality of red pixel areas R along a first column (or row) B1 may emit red light, a plurality of blue pixel areas B along a second column (or row) B2 may emit blue light, and a plurality of green pixel areas G along a third column (or row) B3 may emit green light, for example. In an embodiment, a plurality of red pixel areas R included in the first column (or row) B1 may be electrically connected to each other, a plurality of blue pixel areas B included in the second column (or row) B2 may be electrically connected to each other, and a plurality of green pixel areas G included in the third column (or row) B3 may also be electrically connected to each other, for example.

Hereinafter, the display panel 100 is described with reference to FIG. 4, which is a cross-sectional view taken along directions D1 and D3 (D1×D3) in FIG. 3.

Referring to FIG. 4, the display panel 100 in an embodiment includes a substrate 110, a plurality of light emitting elements 120A, 120B, and 120C on the substrate 110, and a color conversion region 130 on the plurality of light emitting elements 120A, 120B, and 120C. The color conversion region 130 may include the wavelength conversion structure including the partition wall and the quantum dot composite.

The substrate 110 may be a transparent substrate. In an embodiment, the substrate 110 may include sapphire ($Al_2O_3$), gallium nitride (GaN), silicon carbide (SiC), gallium oxide ($Ga_2O_3$), lithium gallium oxide ($LiGaO_2$), lithium aluminum oxide ($LiAlO_2$), or magnesium aluminum oxide ($MgAl_2O_4$), for example.

An integrated circuit ("IC") unit 111 including a driver which supplies power to each of the light emitting elements 120A, 120B, and 120C and a controller which controls each of the light emitting elements 120A, 120B, and 120C may be included on a top surface of the substrate 110 and/or inside the substrate 110. FIG. 4 is a cross-sectional view of the display panel 100, but for effective understanding, the IC unit 111 is illustrated using a transistor circuit.

A plurality of light emitting elements 120A, 120B, and 120C which emit blue light may be disposed on the substrate 110. The plurality of light emitting elements 120A, 120B, and 120C may emit light by an applied power source or a driving signal.

The plurality of light emitting elements 120A, 120B, and 120C may include a semiconductor light emitting chip such as a light emitting diode ("LED"). The plurality of light emitting elements 120A, 120B, and 120C may include a first light emitting element 120A in the first pixel area PX1 of the display panel 100, and a second light emitting element 120B in the second pixel area PX2, and a third light emitting element 120C in the third pixel area PX3.

Figure 6:
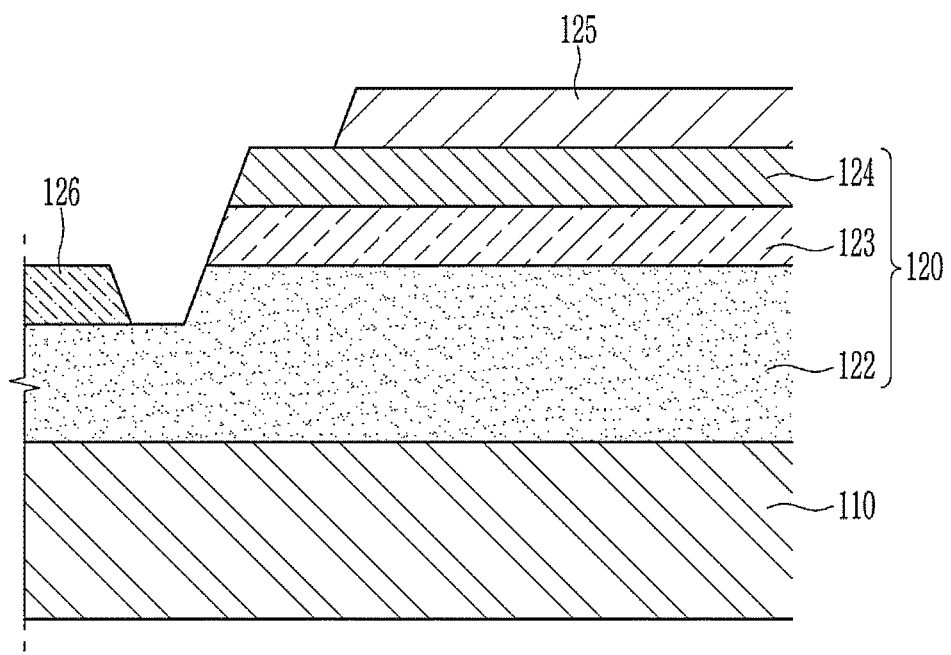
FIG. 6 is a schematic cross-sectional view of an embodiment of a light emitting element, FIG. 7A are photographs that are used to measure contact angles for the compositions of Example 1 and Comparative Examples 1 and 2.

A stacked structure of the individual light emitting elements 120A, 120B and 120C will be explained in detail with reference to FIG. 6.

In an embodiment, the central wavelength of light emitted from the plurality of light emitting elements 120A, 120B, and 120C may be about 430 nanometers (nm) to about 470 nm, and for example, may be about 440 nm to about 460 nm.

A display device 1 in an embodiment may have, for example, a pixel density of from about 200 pixels per inch (ppi) to about 1500 ppi, from about 300 ppi to about 800 ppi, from about 400 ppi to about 500 ppi, or a combination thereof. Accordingly, the horizontal length and the vertical length of each of the light emitting elements 120A, 120B, and 120C, and a pitch between adjacent light emitting elements 120A, 120B, and 120C may be very small compared with the horizontal length of the pixels and the pitch between the pixels of common display devices, for example, an organic LED ("OLED") display, and/or other display devices. In an embodiment, each of the light emitting elements 120A, 120B, and 120C may be a micro LED, for example.

In the specification of the invention, the horizontal length means the length in the D1 direction in FIG. 3, and the vertical length means the length in the D2 direction in FIG. 3.

In an embodiment, the horizontal length and the vertical length of each of the plurality of light emitting elements 120A, 120B, and 120C may be adjusted to fall within a range, for example, less than or equal to about 200 µm, less than or equal to about 150 µm, less than or equal to about 100 µm, less than or equal to about 50 µm, less than or equal to about 20 µm, less than or equal to about 15 µm, less than or equal to about 10 µm, or less than or equal to about 5 µm, and greater than or equal to about 0.1 µm, greater than or equal to about 0.5 µm, greater than or equal to about 1 µm, and may be from about 0.5 µm to about 200 µm, from about 0.5 µm to about 20 µm, or from about 0.5 µm to about 10 µm so that the display device 1 may display an ultra-high resolution image having the aforementioned pixel density.

In an embodiment, the pitch between the adjacent light emitting elements 120A, 120B, and 120C may be for example, less than or equal to about 200 µm, less than or equal to about 150 µm, less than or equal to about 100 µm, less than or equal to about 50 µm, less than or equal to about 20 µm, less than or equal to about 15 µm, less than or equal to about 10 µm, or less than or equal to about 5 µm. It may be greater than or equal to about 0.1 µm, greater than or equal to about 0.5 µm, or greater than or equal to about 1 µm, or may be from about 0.5 µm to about 200 µm, from about 0.5 µm to about 20 µm, or from about 0.5 µm to about 10 µm so that the display device 1 may display an ultra-high resolution image having the aforementioned pixel density.

In the display panel of an embodiment, the horizontal length and the vertical length of each of the plurality of plurality of light emitting elements 120A, 120B, and 120C and/or the pitch between the light emitting elements 120A, 120B, and 120C satisfy the above range. In an embodiment, the display device 1 including the display panel may show an image with ultra-high resolution and ultra-high brightness compared with conventional display devices.

As an example, a plurality of light emitting elements 120A, 120B, and 120C may be electrically connected to each other. In an embodiment, the first light emitting elements 120A disposed in the first pixel area PX1 may be electrically connected to each other, for example. The second light emitting elements 120B disposed in the second pixel area PX2 may be electrically connected to each other. The third light emitting elements 120C disposed in the third pixel area PX3 may be electrically connected to each other. In an embodiment, the first light emitting elements 120A may be electrically connected through a drain electrode, for example. This is also the same for the second light emitting elements 120B and the third light emitting elements 120C.

Due to this connection, the light emitting elements 120A, 120B, and 120C in a region emitting light of the same color may be simultaneously driven. In an embodiment, a configuration in which the drain electrodes are connected to each other has been described, but it is not limited thereto, and any wiring connection through which a plurality of light emitting elements 120A, 120B, and 120C may be simultaneously driven may be enabled.

A protective layer 121 may be disposed on the plurality of light emitting elements 120A, 120B, and 120C. The protective layer 121 may be an inorganic material or an organic material. When the protective layer 121 includes an inorganic material, the inorganic material may include silicon oxide or silicon nitride. The protective layer 121 may planarize the upper surface while covering the plurality of light emitting elements 120A, 120B, 120C.

A color conversion region 130 may be disposed on the plurality of light emitting elements 120A, 120B, and 120C.

The color conversion region 130 may include a plurality of wavelength conversion regions 130R, 130B, and 130G, each of which includes a quantum dot polymer composite in a space or volume defined by the partition walls (including a plurality of sidewalls), and the spaces or the regions may be overlapped with the plurality of light emitting elements 120A, 120B, and 120C, respectively.

In an embodiment, the color conversion region 130 may include a first wavelength conversion regions 130R including a first quantum dot composite that converts third light into a first light, and a second wavelength conversion regions 130G including a second quantum dot composite that converts third light into a second light, and a third (wavelength conversion) regions 130B optionally including a transparent composite or a third quantum dot composite, for example.

In an embodiment, the first wavelength conversion region 130R may include red quantum dots 3R, for example. Accordingly, the incident blue light may be converted into red light that is then emitted from the composite.

In an embodiment, the second wavelength conversion regions 130G may include green quantum dots 3G, for example. Accordingly, the incident blue light may be converted into green light that is then emitted from the composite.

In an embodiment, blue light may be incident on the third region 130B, and the third region 130B may transmit incident light as it is without converting the incident light. In an embodiment, the third region 130B may include a third quantum dot composite including third quantum dots emitting a third light.

Details of the first quantum dot composite, the second quantum dot composite, and the third quantum dot composite, the space, and the partition wall are the same as described herein.

In an embodiment, the quantum dots 3R and 3G included in the first wavelength conversion regions 130R, and the second wavelength conversion regions 130G, respectively, may independently include a Group II-VI compound, a Group III-V compound, a Group IV-VI compound, a Group IV element, a Group IV compound, a Group I-III-VI compound, a Group I-II-IV-VI compound, or a combination thereof. Additional details of the quantum dots 3R and 3G are recited herein.

The third region 130B may transmit the incident light as is. For example, the third region 130B may include a transparent resin transmitting blue light and further include metal oxide fine particles. The third region 130B disposed in a region where the blue light emits may include a quantum dot composite (e.g., a third quantum dot composite) or may not include a quantum dot.

Although not shown in the drawings, the third region 130B may further include a dye, a pigment, or a combination thereof. The third region 130B including the dye or the pigment may reduce reflection of an external light and provide blue light having improved color purity.

Figure 5A:
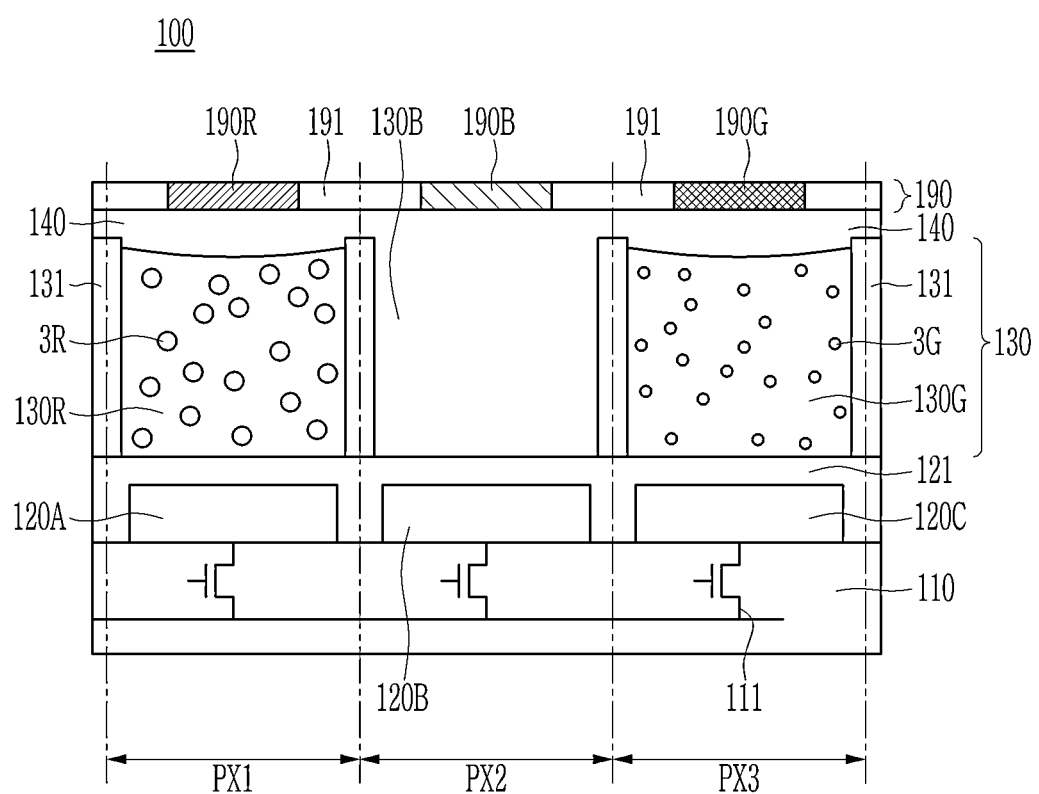
FIG. 5A is a schematic cross-section view of a display panel including a color conversion region and a light emitting element of an embodiment.

In an embodiment, as shown in FIG. 5A, the third region 130B may not include any composite. In an embodiment, the overcoat layer 140 may fill the empty space of the third region 130B.

Each of the first wavelength conversion regions 130R, the second wavelength conversion regions 130G, and the third region 130B may be spaced apart by the aforementioned partition walls 131 (e.g., including a plurality of sidewalls). The first wavelength conversion regions 130R, the second wavelength conversion regions 130G, and the third region 130B may include the (first, second, and optionally third) quantum dot composite in the (first, second, and third) space or volume defined by the partition wall 131, respectively. Each of the first wavelength conversion regions 130R, the second wavelength conversion regions 130G, and the third region 130B may be disposed so as to overlap with each of the first to third light emitting elements 120A, 120B, and 120C.

The partition wall 131 may include a plurality of side walls that are arranged in a lattice shape along directions D1 and D2 of FIG. 3. The partition wall 131 may include an organic material or an inorganic material. Details of the partition wall are the same as described herein.

The partition wall 131 provides a partition corresponding to each of the pixel areas PX1, PX2, and PX3 to prevent color mixing between the pixels of the first wavelength conversion regions 130R, the second wavelength conversion regions 130G, and the third regions 130B. The light emitted from the first wavelength conversion regions 130R, the second wavelength conversion regions 130G, and the third regions 130B may be then directed toward a plurality of absorption-type color filters 190R, 190G, and 190B (for example, see FIG. 4 or FIG. 5A).

The surfaces of the partition wall 131 may be covered with a light reflecting layer (not shown in the drawing). The light reflecting layer may cover all the surfaces of the partition wall 131 except for the surface in which the partition wall 131 contacts the absorption-type color filters 190R, 190G, and 190B.

In an embodiment, the light reflecting layer may include a metal such as Al, Cu, Ni, Ag, Au, or an alloy thereof; an oxide of molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide or a combination thereof; or a combination thereof.

In an embodiment, the light reflecting layer may have visible light reflectance of greater than or equal to about 50 percent (%), for example, greater than or equal to about 60%, greater than or equal to about 70%, greater than or equal to about 80%, greater than or equal to about 90%, or even about 100%.

Accordingly, light supplied to the plurality of the quantum dot composite in the wavelength conversion regions 130R and 130G may be reflected by the light reflecting layer to reach the quantum dots 3R and 3G. As a result, the plurality of the quantum dot composite in the wavelength conversion regions 130R and 130G may exhibit improved light extraction efficiency.

Figure 5B:
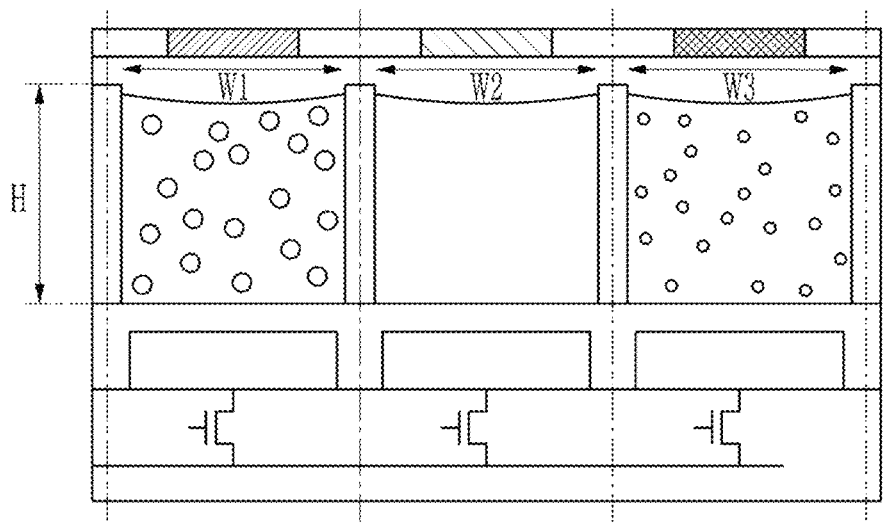
FIG. 5B is a schematic cross-section view of a display panel including a color conversion region and a light emitting element of an embodiment.

FIG. 5B shows a schematic cross-section of a display panel, in which the width W1, W2, or W3, and the height H (or depth) of the space or volume, or the wavelength conversion region (130R, 130G) and the third region (130B) are illustrated in detail.

As shown in FIG. 5B, the height of the space or the wavelength conversion region 130R, 130G and the third region 130B may be the length extending in a direction substantially parallel to a light extraction direction (the D3 direction in FIG. 3). The width of the space or the wavelength conversion region 130R, 130G and the third region may be the length extending in a direction substantially vertical to a light extraction direction (for example the D1 or D2 direction of FIG. 3).

The width W1, W3, or W2 of the wavelength conversion region 130R, 130G and the third region 130 B may correspond to the width of the space. The height of the wavelength conversion region 130R, 130G and the third region 130 B may correspond to the height of the space or the partition wall. The details of the width and the height of the space are the same as recited herein.

In an embodiment, the width W1 of the first wavelength conversion region 130R, the width W3 of the first wavelength conversion region 130G, and the W2 of the third region 130B may be less than or equal to about 40 μm, less than or equal to about 35 μm, less than or equal to about 30 μm, less than or equal to about 28 μm, less than or equal to about 25 μm, less than or equal to about 20 μm, less than or equal to about 15 μm, less than or equal to about 12 μm, less than or equal to about 10 μm, less than or equal to about 8 μm, or less than or equal to about 5 μm. The width W1, W2, or W3 may be from about 0.5 μm to about 20 μm, from about 1 μm to about 18 μm, or from about 3 μm to about 15 μm, or from about 5 μm to about 12 μm. Details of the width and the height of the space recited herein may be applied to the width and the height of the wavelength conversion region and the third region.

In an embodiment, the display panel has the dimensions of the wavelength conversion region and the third region recited herein and in the pixel areas PX1, PX2, and PX3, the light provided from the light emitting element 120A, 120B, and 120C may readily and efficiently enter into the wavelength conversion regions and the third region 130R, 130B, 130G.

For the wavelength conversion regions and the third region 130R, 130G, 130B, a ratio of the height with respect to width may correspond to the aspect ratio recited herein. Details of the aspect ratio may be applied to the ratio of the height with respect to width for the wavelength conversion regions and the third region.

In an embodiment, a ratio of the height H with respect to the width W1, W3, W2 for the wavelength conversion regions 130R, 130G and the third region 130B may be less than or equal to about 3.5:1, less than or equal to about 3:1, less than or equal to about 2.5:1, less than or equal to about 2.3:1, less than or equal to about 2.2:1, less than or equal to about 2:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, or less than or equal to about 1:1. In an embodiment, the ratio may be less than 1:1. In an embodiment, the ratio may be greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, or greater than or equal to about 2:1.

In the wavelength conversion region 130R, 130G and optionally the third region 130B, the space or volume may have a shape of a trench hole or a via hole and/or may have the dimension recited herein, and by using the ink composition having the components recited herein together with the controlled properties (e.g., the contact angle together with the viscosity at the recited total solid content), the quantum dot composite may fill the space or volume with greater than or equal to about 90 volume %, greater than or equal to about 91 volume %, greater than or equal to about 92 volume %, greater than or equal to about 93 volume %, greater than or equal to about 94 volume %, greater than or equal to about 95 volume %, greater than or equal to about 96 volume %, greater than or equal to about 97 volume %, greater than or equal to about 98 volume %, greater than or equal to about 99 volume %, and less than or equal to about 100 volume %.

In an embodiment, the first, the second, or the third quantum dot composite may fill the first, second, or the third space defined by the partition wall at a volume percentage of greater than or equal to about 90 volume %, greater than or equal to about 91 volume %, greater than or equal to about 92 volume %, greater than or equal to about 93 volume %, greater than or equal to about 94 volume %, greater than or equal to about 95 volume %, greater than or equal to about 96 volume %, greater than or equal to about 97 volume %, greater than or equal to about 98 volume %, greater than or equal to about 99 volume %, up to or less than about 100 volume %. At least a portion of the surface of the partition wall may contact the quantum dot composite.

In an embodiment, the overcoat layer 140 may cover and optionally planarize the surfaces of the first wavelength conversion regions 130R and the second wavelength conversion regions 130G. In an embodiment, the overcoat layer 140 may fill an empty space of the third region 130B. In an embodiment, the overcoat layer 140 may cover or fill the open face of the space.

The overcoat layer 140 may be an inorganic material or an organic material. When the overcoat layer 140 includes an inorganic material, the inorganic material may include silicon oxide or silicon nitride.

A thickness of the overcoat layer 140 may vary depending on the thickness of the color conversion region 130, the target thickness of the display panel 100, and the brightness and/or heat generation of each of the light emitting elements 120A, 120B, and 120C. In an embodiment, the thickness of the overcoat layer 140 may be, for example, greater than or equal to about 1 μm, greater than or equal to about 2 μm, greater than or equal to about 3 μm, greater than or equal to about 4 μm, or greater than or equal to about 5 μm, and, for example, less than or equal to about 10 μm, less than or equal to about 9 μm, or less than or equal to about 8 μm, for example, about 1 μm to about 10 μm, about 1 μm to about 9 μm, about 1 μm to about 8 μm, about 2 μm to about 8 μm, about 3 μm to about 8 μm, about 4 μm to about 8 μm, or about 5 μm to about 8 μm.

In an embodiment, the color conversion region 130 may be easily planarized and heat transferred from the plurality of light emitting elements 120A, 120B, and 120C of the light emitting element may be absorbed and/or blocked by the overcoat layer 140, and thus degradation of the color conversion region 130 may be effectively prevented.

As shown in FIGS. 3, 4, 5A, and 5B, an optical element 190 may be disposed on the color conversion region. In an embodiment, the incident light may include blue light and optionally green light. The optical element may cut or absorb the incident light or a portion thereof from the light emitting element or the light source. The optical element may a blue (or incident light) cut filter. The optical element 190 may include a plurality of the absorption-type color filters 190R, 190G, and 190B disposed on each of the quantum dot color filters. The plurality of absorption-type color filters 190R, 190G, and 190B may be disposed so as to be overlapped with the wavelength conversion region 130R and 130G and the third region 130B, respectively. On the third region, the absorption-type color filter 190B may be or may not be disposed. On the third region, the absorption-type color filter 190B may block or cut green light.

The absorption-type color filters 190R, 190G, and 190B may include a material capable of absorbing visible light in a predetermined wavelength region. The color purity of light finally emitted from each pixel of the display panel 100 may be further improved by the absorption type color filter.

A material capable of absorbing visible light in a predetermined wavelength range may be an inorganic material or an organic material. In an embodiment, the plurality of absorption-type color filters 190R, 190G, and 190B may be an adhesive film (e.g., an anisotropic conductive film) including a material capable of absorbing visible light in a predetermined wavelength region, for example.

In an embodiment, the optical element 190 may include a first absorption-type color filter 190R in the first pixel area PX1 and a second absorption-type color filter 190G in the third pixel area PX3, and optionally a third absorption-type color filter 190B in the second pixel area PX2. Each of the plurality of absorption-type color filters 190R, 190G, and 190B may be disposed so as to be overlapped with each of the plurality of light emitting elements 120A, 120B, and 120C.

In an embodiment, the first absorption-type color filter 190R may have a light absorption rate of greater than or equal to about 50%, for example, greater than or equal to about 60%, greater than or equal to about 70%, greater than or equal to about 80%, greater than or equal to about 90%, or even 100% for visible light in a wavelength region other than red light.

In an embodiment, the second absorption-type color filter 190G may have a light absorption rate of greater than or equal to about 50%, for example, greater than or equal to about 60%, greater than or equal to about 70%, greater than or equal to about 80%, greater than or equal to about 90%, or even 100% for visible light in a wavelength region other than green light.

In an embodiment, the third absorption-type color filter 190B may have a light absorption rate of greater than or equal to about 50%, for example, greater than or equal to about 60%, greater than or equal to about 70%, greater than or equal to about 80%, greater than or equal to about 90%, or even 100% for visible light (e.g., green light) in a wavelength region other than blue light.

The plurality of absorption-type color filters 190R, 190G, and 190B may be spaced apart from each other by the black matrix 191. The black matrix 191 may be arranged in a lattice shape along the directions D1 and D2 of FIG. 3. The black matrix 191 may be an organic material, an inorganic material, or a metal.

The black matrix 191 partitions the first pixel area to the third pixel area PX1, PX3, and PX2 to prevent color mixing of light emitted from a plurality of wavelength conversion regions 130R and 130G, and the third regions 130B and the light supplied to the plurality of absorption-type color filters 190R, 190G, and 190B may be guided to be emitted to the outside of the display panel 100.

In an embodiment, the vertical length of the black matrix 191 is illustrated to be lower than that of the plurality of absorption-type color filters 190R, 190G, and 190B, but is not limited thereto, for example. It may be equal to or higher than the vertical length of the plurality of absorption-type color filters 190R, 190G, and 190B.

Hereinafter, a plurality of light emitting elements 120A, 120B, and 120C in an embodiment are described in greater structural detail with reference to FIG. 6. FIG. 6 is a schematic cross-sectional view of a light emitting element 120 in an embodiment.

In an embodiment, each of the plurality of light emitting elements 120A, 120B, and 120C includes a first conductivity-type semiconductor layer 122 on the substrate 110 and an active layer 123 on the first conductivity-type semiconductor layer 122, and a second conductivity-type semiconductor layer 124 on the active layer 123 and overlapped with the first conductivity-type semiconductor layer 122, for example.

The first conductivity-type semiconductor layer 122 may be an n-type semiconductor layer and the second conductivity-type semiconductor layer 124 may be a p-type semiconductor layer. In addition, the first conductivity-type semiconductor layer 122 and the second conductivity-type semiconductor layer 124 may include a nitride semiconductor. The first conductivity-type semiconductor layer 122 and the second conductivity-type semiconductor layer 124 may have a composition formula of $Al_xIn_yGa_{(1-x-y)}N$ (wherein, $0 \le x \le 1$, $0 \le y \le 1$, and $0 \le x+y \le 1$). The first conductivity-type semiconductor layer 122 and the second conductivity-type semiconductor layer 124 may include at least one material of GaN, AlGaN, and InGaN. In an embodiment, the first conductivity-type semiconductor layer 122 may include a nitride semiconductor material doped with an n-type and the second conductivity-type semiconductor layer 124 may include a nitride semiconductor material doped with a p-type, for example. In an embodiment, the first conductivity-type semiconductor layer 122 may include GaN doped with an n-type and the second conductivity-type semiconductor layer 124 may include GaN doped with a p-type, for example.

The active layer 123 may emit light having predetermined energy due to recombination of electrons and holes and have a multi quantum wells ("MQW") structure of alternately stacking the quantum well layer and the quantum barrier layer. The MQW structure may have an InGaN/GaN structure. The first conductivity-type semiconductor layer 122, the active layer 222, and the second conductivity-type semiconductor layer 124 may be epitaxial layers.

In an embodiment, the plurality of light emitting elements 120A, 120B, and 120C may be provided by a metal-organic chemical vapor deposition ("MOCVD"), hydride vapor phase epitaxy ("HVPE"), or molecular beam epitaxy ("MBE") process, for example.

Although not shown in the drawings, a nitride semiconductor thin film may be disposed between the substrate 110 and the plurality of light emitting elements 120A, 120B, and 120C. The nitride semiconductor thin film may serve as a buffer layer to mitigate lattice mismatch between the substrate 110 and the first conductivity-type semiconductor layer 122.

The first conductivity-type semiconductor layer 122 may be connected to a first electrode 126, and the second conductivity-type semiconductor layer 124 may be connected to a second electrode 125. The first electrode 126 and the second electrode 125 are separated and do not contact each other.

The first electrode 126 and the second electrode 125 may include a metal or an alloy having high reflectance in a wavelength region of light emitted from each of the light emitting elements 120A, 120B, and 120C. The first electrode 126 and the second electrode 125 may each include a single layer including a single material of Au, Sn, Ni, Pb, Ag, In, Cr, Ge, Si, Ti, W, and Pt or an alloy including at least two materials thereof or a multilayer including a combination thereof.

Hereinafter, the embodiments are illustrated in more detail with reference to examples. However, they are exemplary embodiments of the present invention, and the present invention is not limited thereto.

EXAMPLES

Analysis Method
[1] Photoluminescence Analysis
Photoluminescence Analysis is conducted using Hitachi F-7000 spectrometer.
[2] Blue Light Absorption Ratio, Light Conversion Ratio, and Light Conversion Efficiency of Quantum Dot Composites.

The light amount (B) of blue excitation light is determined using an integrating sphere. A Quantum Dot (QD) composite is positioned within an integrating sphere and then irradiated with blue excitation light (B) to measure a light dose (A) of green (or red) light emitted from the QD composite and a light dose (B') of blue light emitted from (i.e., passed through) the QD composite.

The measured results are used to calculate a blue light absorption ratio, a blue light conversion ratio, and a light conversion efficiency in accordance with the following equations.

$$\text{blue light absorption ratio} = (B-B')/B$$

$$\text{light conversion ratio} = A/B$$

$$\text{light conversion efficiency (CE)} = A/(B-B')$$

[3] Viscosity
A viscosity of the (ink) composition is measured by using Brookfield LVDV-II-Rheometer or HAAKE RheoStress 600.
[4] Contact Angle
A contact angle measurement of the (ink) composition applied to a Si substrate is conducted with an apparatus (model name: DSA 10) from KRUSS Co. Ltd. according to the ring method.
[5] Microscopy Analysis
A microscopy analysis is carried out using a microscope (model name: OLS3000) from Olympus Co. Ltd.

Preparation Example (1) Composition Preparation
A chloroform dispersion of (green light emitting) indium phosphide based core/ZnSe shell quantum dots having oleic acid as an organic ligand on a surface of the quantum dot are prepared. The chloroform dispersion is mixed with a binder (a quaternary copolymer of methacrylic acid, benzyl methacrylate, hydroxyethyl methacrylate, and styrene, acid value: 130 mg KOH/g, molecular weight: 8000) solution to prepare a quantum dot-binder dispersion.

The quantum dot binder dispersion is further mixed with a hexaacrylate having the following structure as a photopolymerizable monomer, glycol di-3-mercaptopropionate (hereinafter, 2T), an oxime ester compound as an initiator, and $TiO_2$ as a light diffusing agent, and PGMEA to prepare a composition.

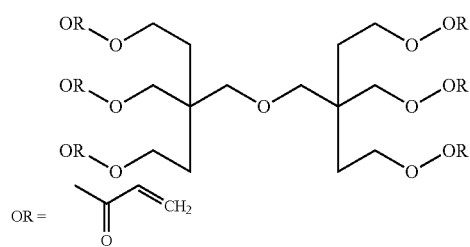

An amount of the photoinitator is about 1 wt % based on a total solid content and in the total solid content, a weight ratio of the monomer combination (i.e., the sum of hexaacrylate and the thiol compound) and the binder is 1:2.2.

(2) Preparation of Conversion Structure

A base structure is prepared wherein a Si partition wall is positioned on a substrate to define a trench hole with a height of about 30 micrometers (μm) and a width of about 15 μm to 20 μm, and an aspect ratio of from about 1.5 to about 2. The composition prepared as above is spray coated at a spray pressure of about 6 psi and a transporting speed of about 50 millimeters per second (mm/s) to fill the trench hole. The structure is pre-baked at about 100° C., and exposed to irradiation of light (a wavelength: 365 nanometers (nm), intensity: 100 millijoules (mJ) for 1 second under a mask having a stripe pattern). The structure is then developed in a potassium hydroxide aqueous solution (a concentration: 0.043 weight percent (wt %) for 50 seconds to obtain a wavelength conversion structure.

The obtained structure is heat-treated (post-baked, POB) at 180° C. for 30 minutes under a nitrogen atmosphere.

Example 1, Comparative Example 1, and Comparative Example 2

Figure 7A:
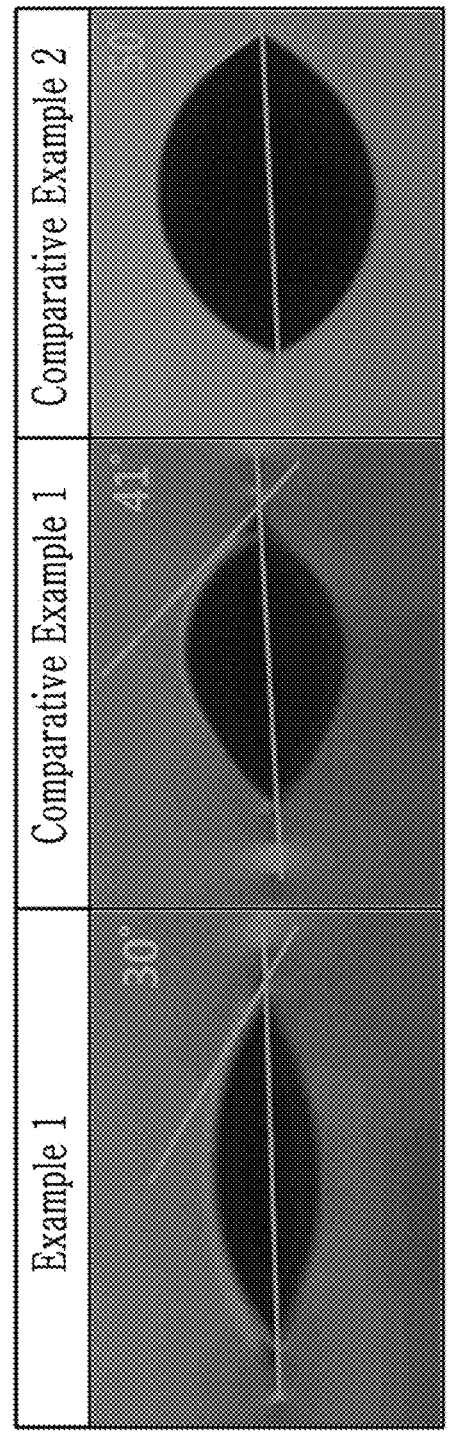
FIG. 7B shows cross-section micrographs along with corresponding top view micrographs for the wavelength conversion structure prepared in Example 1 and Comparative Examples 1 and 2.

Three ink compositions having a total solid content of 23 wt % and including a metal oxide fine particle ($TiO_2$) are prepared for Example 1, and Comparative Examples 1 and 2 by varying the amount of the quantum dot as shown in Table 1, respectively. For each of the compositions of Example 1, and Comparative Examples 1 and 2, the viscosity and the contact angle are measured and the results are shown in Table 1 and FIG. 7A.

Figure 7B:
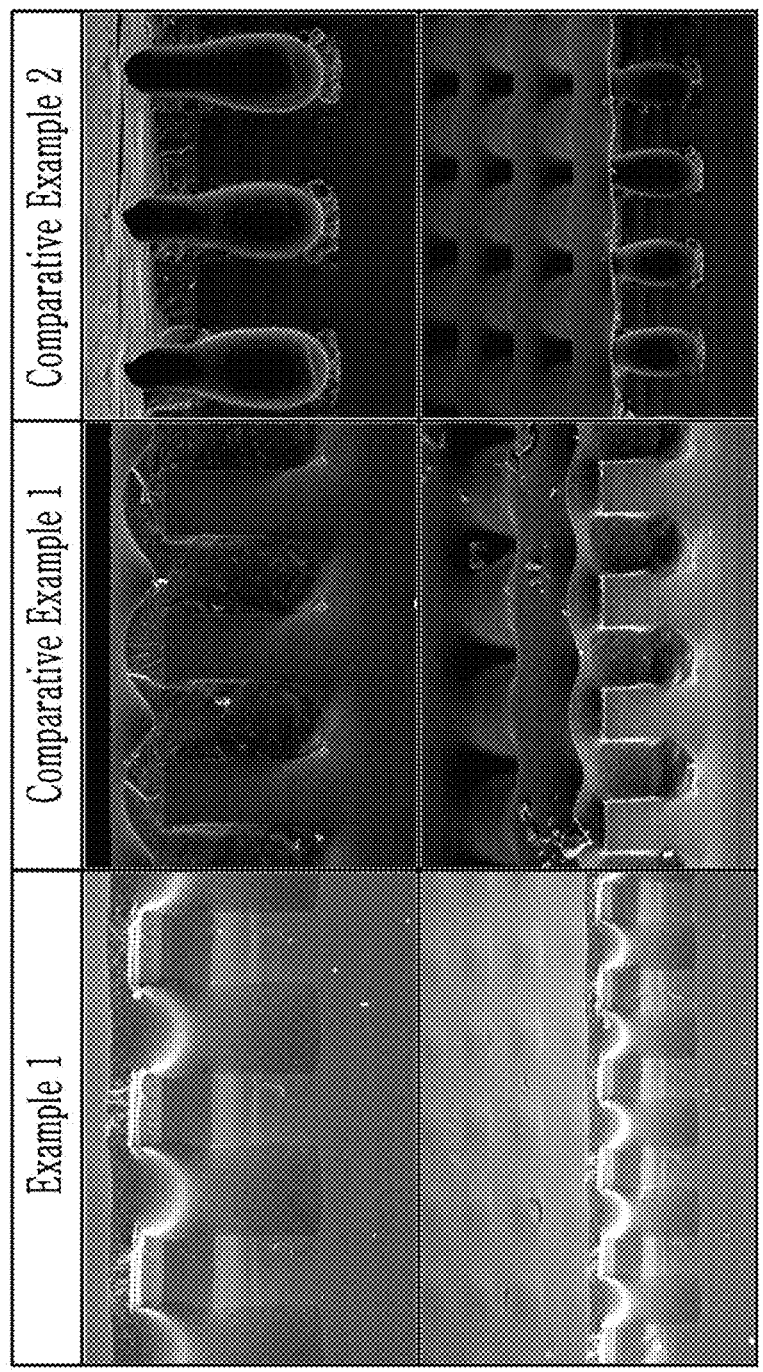

Each of the ink compositions is used to prepare a corresponding wavelength conversion structure. A cross-section image for each structure is obtained using microscopy analysis and the results are shown in FIG. 7B.

TABLE 1

| A total solid content of the composition: 23 wt % | | | |
|---|---|---|---|
| | Example 1 | Comp. Example 1 | Comp. Example 2 |
| Amount of QD | 23 wt % | 33 wt % | 43 wt % |
| Amount of $TiO_2$ | 1.75 wt % | 1.75 wt % | 1.75 wt % |
| Viscosity | 4.1 cps | 4.6 cps | 5.2 cps |
| Contact Angle | 30 degrees | 41 degrees | 50 degrees | cps (centipoise)

Referring to Table 1, the composition of Example 1 has a viscosity and contact angle that are different from the compositions of Comparative Example 1 and Comparative Example 2. The results of Table 1 indicate that as the amount of the quantum dots in the ink compositions increases, the viscosity and the contact angle increase as well. Without wishing to be bound by any theory, a greater amount of the quantum dots in the composition may cause an increase of the organic ligand in the composition, and a greater amount of the organic ligand may result in an increase of the viscosity, A greater amount of the quantum dots in the composition also cause an increase hydrophobicity of the composition, resulting in an increase of a contact angle of the composition.

The micrographs of FIG. 7B show that in the structure of Example 1, the quantum dot composite fills at least 95% of the inside space of the trench hole to provide a top surface below the open face of the space.

In addition, the micrographs confirm that the cross-section area of the quantum dot composite accounts for about 70% or higher (e.g., 75% or 85%) of the vertical cross-section area of the space defined by the partition wall. From the results, it is believed that at least 95% of the area of the inner surface of the space (i.e., trench hole) defined by the partition wall is in contact with the quantum dot composite. In the structure of Example 1, the quantum dot composite may fill the edge portions of the trench hole (i.e., formed with the bottom surface and the partition wall).

In contrast, in the composite structures of Comparative Example 1 and Comparative Example 2, the quantum dot composites do not substantially fill the trench hole of the structure. The results show that most of the composition of Comparative Example 1 or 2 was not able to enter the trench hole, and instead, the entrance of the trench hole become plugged by the composition.

The above results indicate that the composition of Example 1 can be used to provide a 200 pixels per inch (ppi) or 300 ppi high definition trench hole type structure having the quantum dot composite positioned in a hole (e.g., having a trench shape).

Comparative Example 3 and Comparative Example 4

Figure 8A:
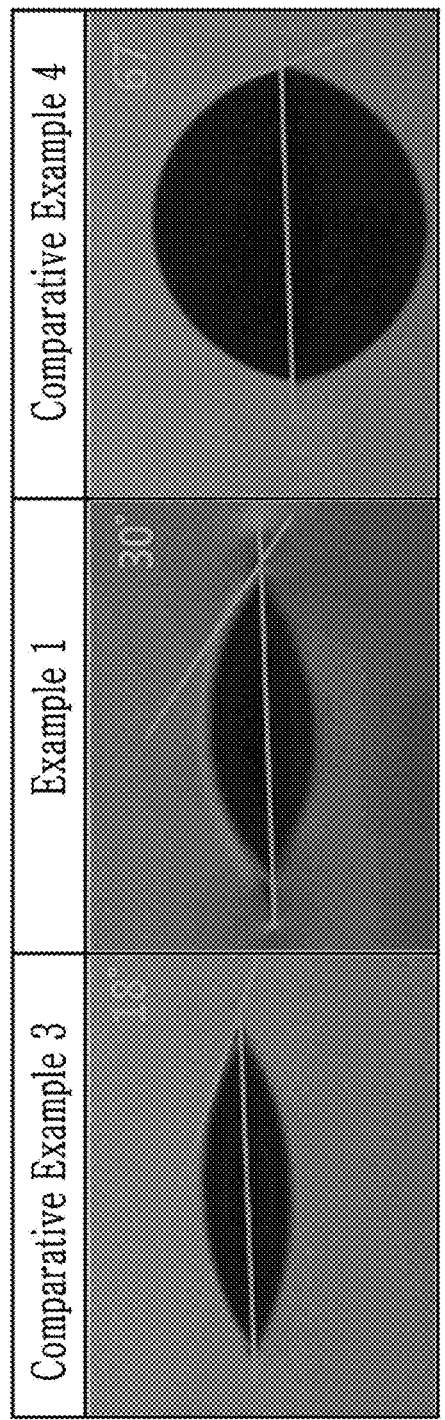
FIG. 8A illustrates a measurement of contact angles for the compositions of Example 1 and Comparative Examples 3 and 4.

In order to compare the composition of Example 1, two comparative ink compositions, Comparative Example 3 and Comparative Example 4, each having an amount of quantum dots of 23 wt % and a titanium oxide of 1.75 wt % are prepared by changing an amount of an organic substance (e.g., a binder and/or a monomer) to control a total solid content thereof as shown in Table 2. The viscosity and the contact angle for each composition are measured and the obtained values are shown in Table 2 and FIG. 8A.

Figure 8B:
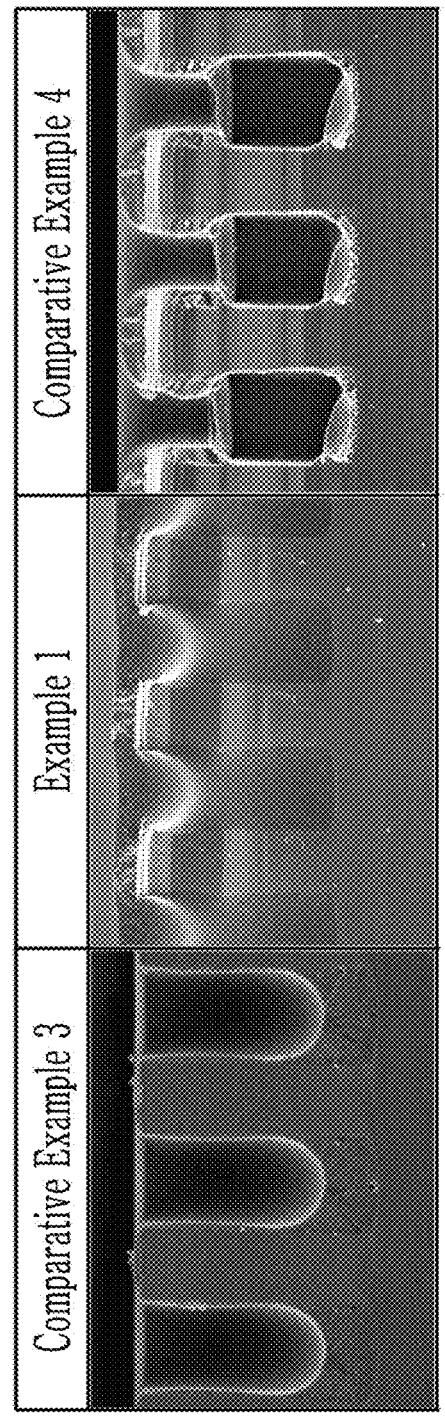
FIG. 8B shows cross-section images for the wavelength conversion structure prepared in Example 1 and Comparative Examples 3 and 4.

The compositions are then applied to the trench hole patterns as above to provide wavelength conversion structures. A cross-section microscopic image for each structure is obtained and the results are shown in FIG. 8B

TABLE 2

| Amount of quantum dots: 23 wt % | | | |
|---|---|---|---|
| | Comparative Example 3 | Example 1 | Comparative Example 4 |
| Total Solid Content | 20 wt % | 23 wt % | 25 wt % |
| $TiO_2$ amount | 1.75 wt % | 1.75 wt % | 1.75 wt % |
| Viscosity | 3.5 cps | 4.1 cps | 6 cps |
| Contact Angle | 18 degrees | 30 degrees | 67 degrees |

The results of Table 2 show that a change in the total solid content may affect the viscosity and the contact angel) an increase in the total solid content can result in increases of the viscosity and the contact angle of the composition, at the same time.

Referring to FIG. 8B, the composition of Comparative Examples 3 and 4 were not to provide a wavelength conversion structure including a quantum dot composite adequately filling the trench holes. The composition of Comparative Example 4 was not able to fill the trench and instead clogged or plugged the entrance of the trench hole.

The results of FIG. 8B for the composition of comparative Example 3 show that even when a composition has a viscosity of less than 4.5 cps, the contact angle of less than 20 degrees for the composition in its entirety can precludes the composition from adequately filling the trench hole.

Experimental Example 1: Evaluation of the Optical Properties of the Quantum Dot Composite Using the composition of Example 1, a wavelength conversion structure having a height of 19 um is prepared and for the structure, the photoluminescent wavelength, a full width at half maximum, a light conversion ratio, a light absorption ratio, and a conversion efficiency are measured and shown in Table 3.

TABLE 3

|  | Example 1 |
| --- | --- |
| QD amounts | 23 wt % |
| Peak(nm) | 533 nm |
| FWHM(nm) | 34 nm |
| Light conversion ratio | 33.4% |
| Absorption ratio | 80% |
| CE(Conversion Efficiency) | 42.2% |

Referring to Table 3, the composite prepared in Example 1 can show a desired degree of higher performing optical properties (e.g., light conversion ratio, absorption ratio, and conversion efficiency).

Example 2

Example 2 composition is prepared in a manner in accordance with Example 1 except that red light emitting InP based core/ZnSe shell quantum dots having an organic ligand on a surface are used. The Example 2 composition has a viscosity of 4.4 cps and a contact angle of 39 degrees. A wavelength conversion structure is then prepared in accordance with Example 1. A microscopy analysis of Example 2 is conducted and the results shown in FIG. 9A.

Figure 9A:
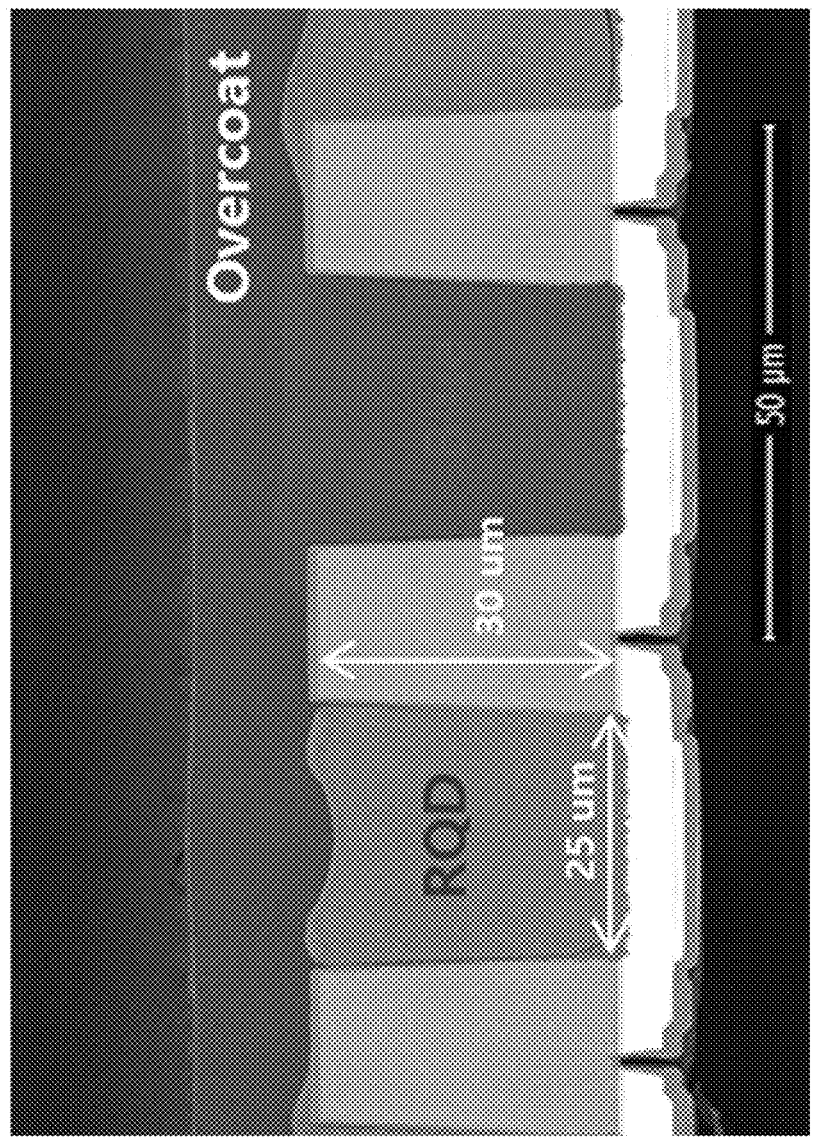
FIG. 9A is a microscope image of a cross-section of the wavelength conversion structure prepared in Example 2.

The results of FIG. 9A shows that the quantum dot composite of Example 2 can fill most of the volume of the trench hole with a top surface located below the open face of the space.

Example 3

Except for using a base structure with a space of a width of 80 μm and a height of 13 μm, a wavelength conversion structure is prepared in accordance with Example 1. A microscopy analysis (micrograph) of Example 3 is conducted and the result is shown in FIG. 9B.

Figure 9B:
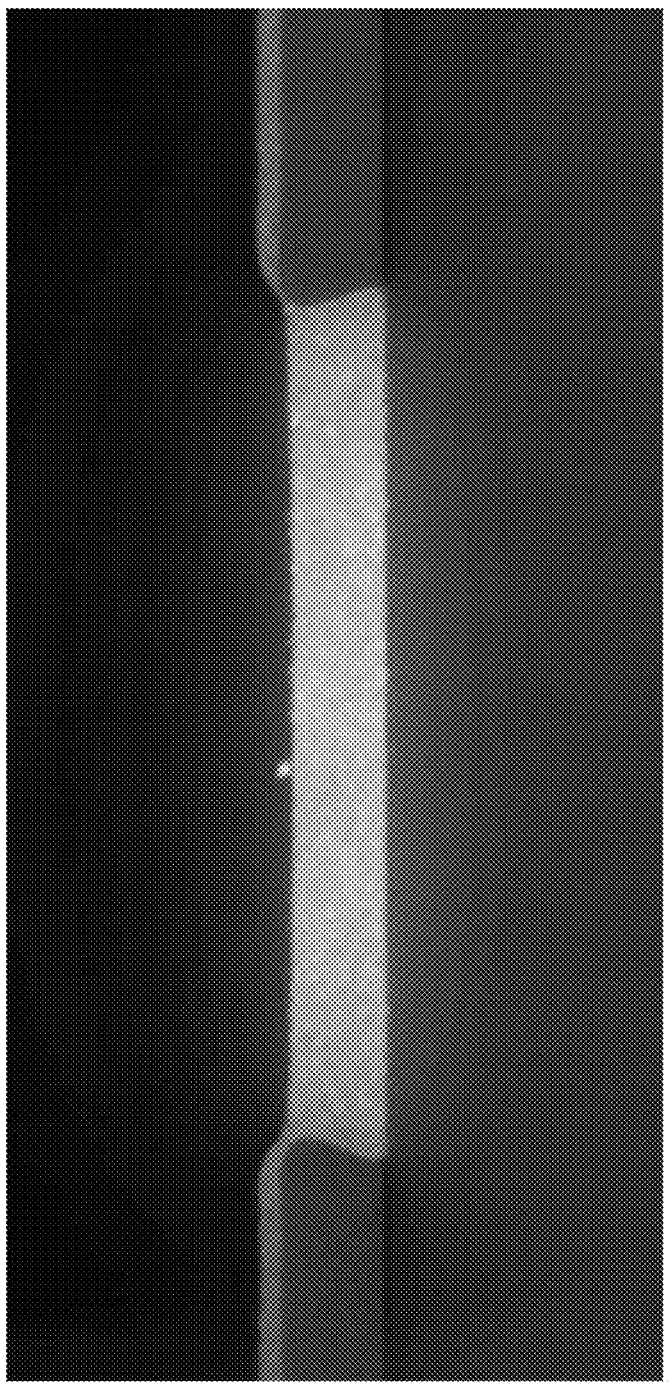
FIG. 9B is a microscope image of a cross-section of the wavelength conversion structure prepared in Example 3.

The results of FIG. 9B shows that the quantum dot composite readily fills most of the space with a top surface below the open face of the space.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

1: Display device
3R, 3G: quantum dots
10: substrate
30: surface
50: liquid drop
100: display panel
110: substrate
111: integration circuit
120A, 120B, 120C: light emitting element
121: protection layer
122: a first conductive semiconductor layer
123: active layer
124: a second conductive semiconductor layer
125: a second electrode
126: a first electrode
130: color conversion region
130R, 130G: first and second wavelength conversion region
130B: a third region
131: partition wall
140: overcoat layer
190: optical element
190R, 190G, 190B: an absorption color filter
191: black matrix

What is claimed is:
1. A display panel, comprising
a light emitting element,
a color conversion region disposed on the light emitting element,
wherein the light emitting element is configured to provide the color conversion region with incident light,
wherein the color conversion region includes a wavelength conversion structure comprising a partitioned base structure including adjacent sidewalls that are configured to provide an open top face area, and a quantum dot composite,
wherein the quantum dot composite is disposed in a volumetric space defined by a height H of the adjacent sidewalls and a bottom surface of the partitioned base structure, and the quantum dot composite comprises a matrix and a plurality of quantum dots dispersed in the matrix,
wherein a width W of the volumetric space is less than or equal to about 80 micrometers,
wherein in the quantum dot composite, an amount of the quantum dots is greater than or equal to about 10 weight percent and less than or equal to about 30 weight percent, based on a total weight of the quantum dot composite, and
wherein the quantum dot composite includes a surface adjacent to the open top face area and includes a gap distance A1, which is a maximum distance between the open top face area and the adjacent surface of the quantum dot composite, and the quantum dot composite satisfies the following equation:

$$0.001 \leq A1/H \leq 0.3$$

wherein
H: the height of the sidewall,
A1: the gap distance.

2. The display panel of claim 1, wherein the height H of each of the adjacent sidewalls is greater than or equal to about 5 micrometers and less than or equal to about 100 micrometers.

3. The display panel of claim 1, wherein the gap distance A1 satisfies the equation:

$$0.005 \leq A1/H \leq 0.15.$$

4. The display panel of claim 3, wherein an aspect ratio is defined by the following equation:

Aspect ratio=$W/H$ wherein
W: the width W of the volumetric space
H: the height H of the sidewall, and
the aspect ratio is less than or equal to about 3.5:1.

5. The display panel of claim 4, wherein the aspect ratio is greater than or equal to about 1.1:1.

6. The display panel of claim 1, wherein a value of the A1/H is greater than or equal to about 0.005 and less than or equal to about 0.29.

7. The display panel of claim 1, wherein the adjacent sidewalls comprise silicon, a silicon oxide, or a combination thereof.

8. The display panel of claim 1, wherein the height H of the sidewall is greater than or equal to about 6 micrometers and less than or equal to about 30 micrometers.

9. The display panel of claim 1, wherein the quantum dot composite fills the volumetric space to occupy greater than or equal to about 70 percent of a vertical cross-section area of the volumetric space.

10. The display panel of claim 1, wherein the width W of the volumetric space is greater than or equal to about 5 micrometers and less than or equal to about 40 micrometers.

11. The display panel of claim 1, wherein the quantum dot composite is configured to emit light having a full width at half maximum of less than or equal to about 45 nanometers.

12. The display panel of claim 1, wherein the quantum dot composite further comprises metal oxide fine particles, and the metal oxide fine particles are present in an amount of greater than or equal to about 0.5 weight percent and less than or equal to about 5 weight percent, based on the total weight of the quantum dot composite.

13. The display panel of claim 1, wherein the display panel further comprises an absorption type color filter layer disposed over the color conversion region.

14. The display panel of claim 1, wherein the light emitting element comprises a plurality of light emitting units, and
the quantum dot composites is one of a plurality of quantum dot composites each of which corresponds to one of the light emitting units of the plurality of light emitting units.

15. The display panel of claim 1, wherein the light emitting unit has a horizontal length of greater than or equal to about 0.1 micrometers and less than or equal to about 200 micrometers.

16. The display panel of claim 1, wherein an overcoat is disposed over the partitioned base structure to cover the quantum dot composite; or
a protective layer is formed between the LED-light emitting element and the quantum dot composite.

17. A display device including the display panel of claim 1.

18. An ink composition comprising:
a liquid vehicle and a quantum dot dispersed in the liquid vehicle,
wherein the ink composition has a viscosity of less than or equal to about 4.5 centipoise, and a contact angle of the ink composition with respect to a silicon substrate is greater than or equal to about 20 degrees and less than or equal to about 40 degrees, and
wherein an amount of the quantum dot in the ink composition is 10 weight percent to 30 weight percent, based on a total solid content of the ink composition.

19. The ink composition of claim 18, further comprises further comprising metal oxide particles in an amount greater than or equal to about 0.5 weight percent and less than or equal to about 5 weight percent, based on the total solid content of the ink composition.

20. The ink composition of claim 18, the total solid content of the ink composition is less than or equal to about 24 weight percent, based on a total weight of the ink composition, and
the liquid vehicle comprises an organic solvent, a polymerizable monomer, or a combination thereof.

21. The ink composition of claim 18, wherein the ink composition has a viscosity of about 3.0 centipoise to about 4.2 centipoise.

* * * * *